(12) United States Patent
Ishii et al.

(10) Patent No.: US 8,111,725 B2
(45) Date of Patent: Feb. 7, 2012

(54) SURFACE-EMITTING LASER, SURFACE-EMITTING LASER ARRAY, OPTICAL SCANNING DEVICE, AND IMAGE FORMING APPARATUS

(75) Inventors: Toshihiro Ishii, Miyagi (JP); Kengo Makita, Kanagawa (JP); Naoto Jikutani, Miyagi (JP); Kazuhiro Harasaka, Miyagi (JP); Shunichi Sato, Miyagi (JP); Satoru Sugawara, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 87 days.

(21) Appl. No.: 12/464,408

(22) Filed: May 12, 2009

(65) Prior Publication Data

US 2009/0285252 A1 Nov. 19, 2009

(30) Foreign Application Priority Data

May 13, 2008 (JP) ................................. 2008-125709
Mar. 30, 2009 (JP) ................................. 2009-081678

(51) Int. Cl.
*H01S 5/00* (2006.01)
(52) U.S. Cl. ................................................. 372/44.011
(58) Field of Classification Search .................. 339/221; 372/44.011, 46.016, 50.124, 43.01, 46.013; 399/221
See application file for complete search history.

(56) References Cited

U.S. PATENT DOCUMENTS

| | | | |
|---|---|---|---|
| 5,923,691 A | 7/1999 | Sato | |
| 5,939,733 A | 8/1999 | Sato | |
| 6,002,700 A | 12/1999 | Sato | |
| 6,072,196 A | 6/2000 | Sato | |
| 6,207,973 B1 | 3/2001 | Sato et al. | |
| 6,233,264 B1 | 5/2001 | Sato | |
| 6,483,860 B1 | 11/2002 | Ueki et al. | |
| 6,542,528 B1 | 4/2003 | Sato et al. | |
| 6,563,851 B1 | 5/2003 | Jikutani et al. | |
| 6,570,905 B1 | 5/2003 | Ebeling | |
| 6,614,821 B1 | 9/2003 | Jikutani et al. | |

(Continued)

FOREIGN PATENT DOCUMENTS

JP 58-197562 11/1983

(Continued)

OTHER PUBLICATIONS

U.S. Appl. No. 11/993,406, filed Dec. 20, 2007 (not yet published).

(Continued)

*Primary Examiner* — Jessica Stultz
*Assistant Examiner* — Tuan Nguyen
(74) *Attorney, Agent, or Firm* — Cooper & Dunham LLP

(57) ABSTRACT

A disclosed surface-emitting laser includes a substrate and multiple semiconductor layers stacked on the substrate. A normal of the principal plane of the substrate is inclined with respect to one of crystal orientations <1 0 0> toward one of crystal orientations <1 1 1>. The semiconductor layers include a resonator structure including an active layer; and a semiconductor multilayer mirror stacked on the resonator structure. The semiconductor multilayer mirror includes a confined structure where a current passage area is surrounded by an oxidized area including at least an oxide generated by oxidation of a part of a selective oxidation layer containing aluminum. A strain field caused by the oxidation is present at least in a part of the vicinity of the oxidized area. In the strain field, the amount of strain in a first axis direction is different from the amount of strain in a second axis direction.

14 Claims, 23 Drawing Sheets

U.S. PATENT DOCUMENTS

| | | | |
|---|---|---|---|
| 6,674,785 B2 | 1/2004 | Sato et al. | |
| 6,765,232 B2 | 7/2004 | Takahashi et al. | |
| 6,803,604 B2 | 10/2004 | Takahashi et al. | |
| 6,927,412 B2 | 8/2005 | Takahashi et al. | |
| 6,959,025 B2 | 10/2005 | Jikutani et al. | |
| 6,975,663 B2 | 12/2005 | Sekiya et al. | |
| 7,141,489 B2 * | 11/2006 | Burgener et al. | 438/478 |
| 7,227,196 B2 * | 6/2007 | Burgener et al. | 257/103 |
| 7,374,976 B2 * | 5/2008 | Maekawa et al. | 438/149 |
| 7,466,738 B2 | 12/2008 | Jikutani | |
| 2004/0165636 A1 | 8/2004 | Ezaki et al. | |
| 2005/0147143 A1 | 7/2005 | Jikutani | |
| 2007/0171949 A1 | 7/2007 | Jikutani | |
| 2007/0280322 A1 | 12/2007 | Sato et al. | |
| 2008/0024849 A1 | 1/2008 | Hayashi et al. | |
| 2008/0055672 A1 | 3/2008 | Watanabe et al. | |
| 2008/0056321 A1 | 3/2008 | Motomura et al. | |
| 2008/0212636 A1 | 9/2008 | Sato et al. | |
| 2008/0233017 A1 | 9/2008 | Sato et al. | |
| 2009/0022199 A1 | 1/2009 | Jikutani et al. | |
| 2009/0262770 A1 | 10/2009 | Itoh et al. | |
| 2009/0278233 A1 * | 11/2009 | Pinnington et al. | 257/615 |
| 2010/0195691 A1 | 8/2010 | Jikutani et al. | |

FOREIGN PATENT DOCUMENTS

| | | |
|---|---|---|
| JP | 2891133 | 2/1999 |
| JP | 2004-140007 | 5/2004 |
| JP | 3551718 | 5/2004 |
| JP | 3606059 | 10/2004 |
| JP | 2005-340779 | 12/2005 |
| JP | 2006-13366 | 1/2006 |
| JP | 3799667 | 5/2006 |
| JP | 3800852 | 5/2006 |
| JP | 4010095 | 9/2007 |
| JP | 2007-318086 | 12/2007 |
| WO | WO02/37630 | 5/2002 |
| WO | WO2007/089042 | 8/2007 |
| WO | WO2008/026460 | 3/2008 |
| WO | WO2008/0264460 A1 * | 3/2008 |

OTHER PUBLICATIONS

U.S. Appl. No. 12/090,467, filed Apr. 16, 2008 (not yet published).
U.S. Appl. No. 12/090,934 filed Apr. 21, 2008 (not yet published).
Ohtoshi, T., et al., "Dependence of optical gain on crystal orientation in surface-emitting lasers with strained quantum wells", *Applied Physics Letters*, vol. 65, No. 15, pp. 1886-1887, Oct. 10, 1994.
Watanabe, Minoru, et al., "Investigation of tensile-strained InGaAlP multiquantum-well active regions by photoluminescence measurements", *Journal of Applied Physics*, vol. 76, No. 12, pp. 7942-7946, Dec. 15, 1994.
Sep. 1, 2010 European search report in connection with counterpart European patent application No. 09251308.
Choquette, K.D. et al. (1996), "Wet Oxidation of AlGaAs vs. AlAs: A Little Galium is Good", Lasers and Electro-Optics Society Annual Meeting, vol. 1, pp. 390-391.
Deppe, D.G. et al. (1997), "Low-Threshold Vertical-Cavity Surgace-Emitting Lasers Based on Oxide-Confinement and High Contrast Distributed Bragg Reflectors", IEEE Journal of Selected Topics in Quantam Electronics, vol. 3, No. 3, p. 900.
Alonzo, A.C. et al. (2000), "Strain in wet thermally oxidized square and circular mesas", Journal of Applied Physics, vol. 87, No. 9, pp. 4594-4599.
Knigge, A. et al. (2002), "650-nm Vertical-Cavity Surface-Emitting Lasers: Laser Properties and Reliability Investigations", IEEE Photonics Techonlogy Letters, vol. 14, No. 10, p. 1386.
Jul. 9, 2010 Chinese official action in connection with counterpart Chinese patent application.

* cited by examiner

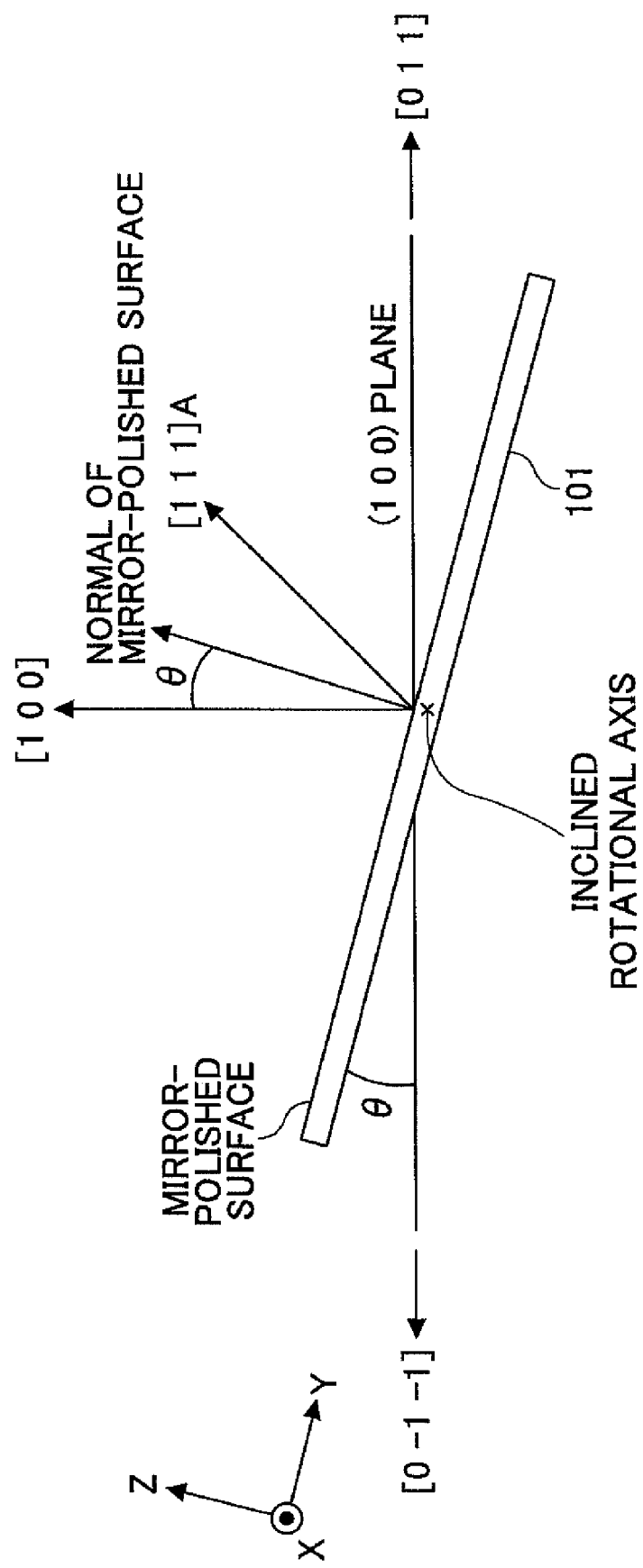

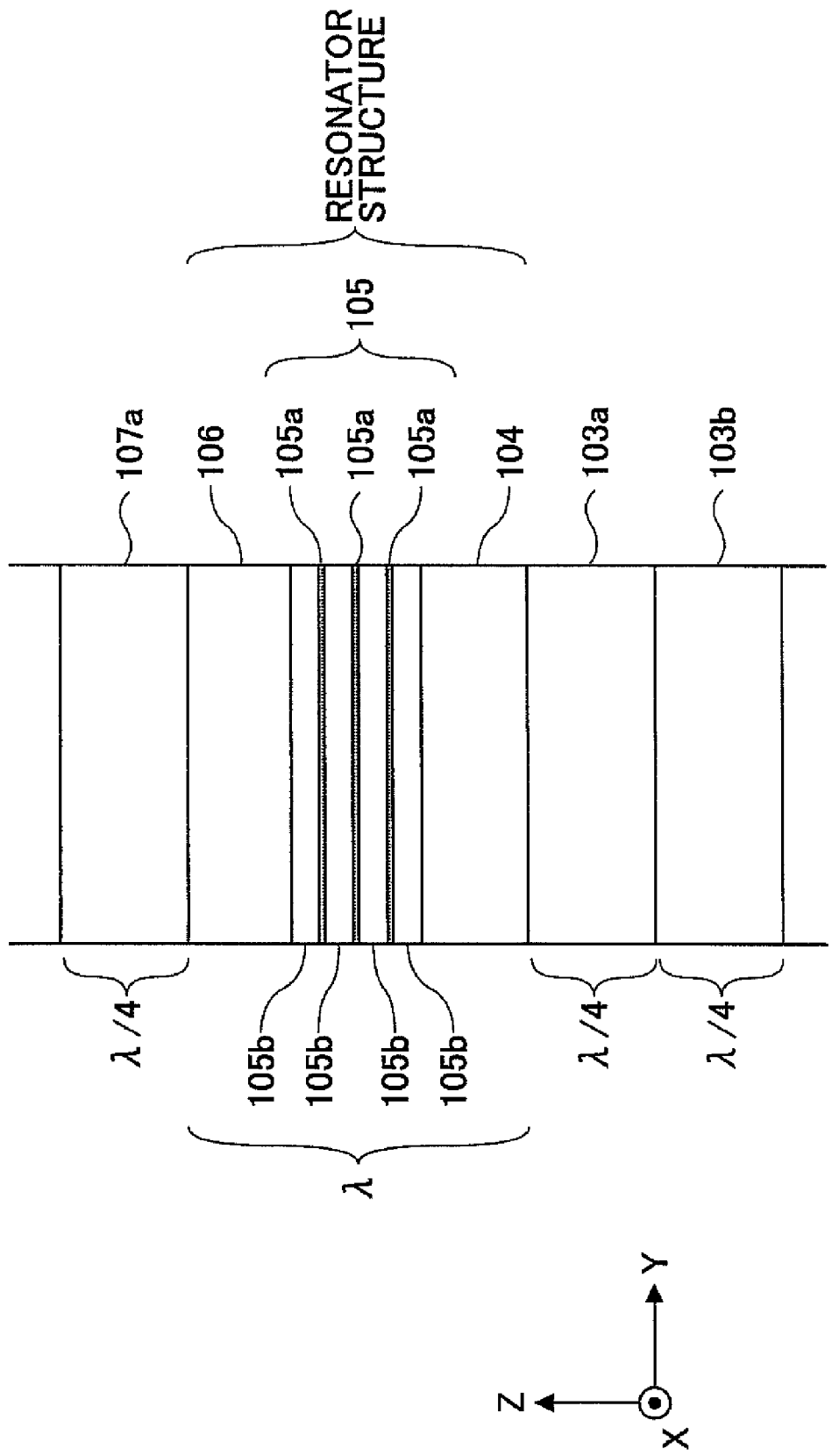

FIG.10B

| DISTANCE (nm) FROM OXIDATION END POINT IN Y-AXIS DIRECTION | 10.1 | 8 | 5.5 | 3 | 2 | 1 | 0.5 | 0.2 |
|---|---|---|---|---|---|---|---|---|
| Sy1 (nm) | 116.4 | 99.4 | 80.4 | 64.9 | 59.5 | 54.9 | 47.4 | 45.2 |
| Sy2 (nm) | 85.6 | 72.1 | 61.2 | 55.2 | 54.8 | 42.6 | 43.5 | 43.2 |
| Sy1−Sy2 (nm) | 30.8 | 27.3 | 19.2 | 9.7 | 4.7 | 12.3 | 3.9 | 2.0 |

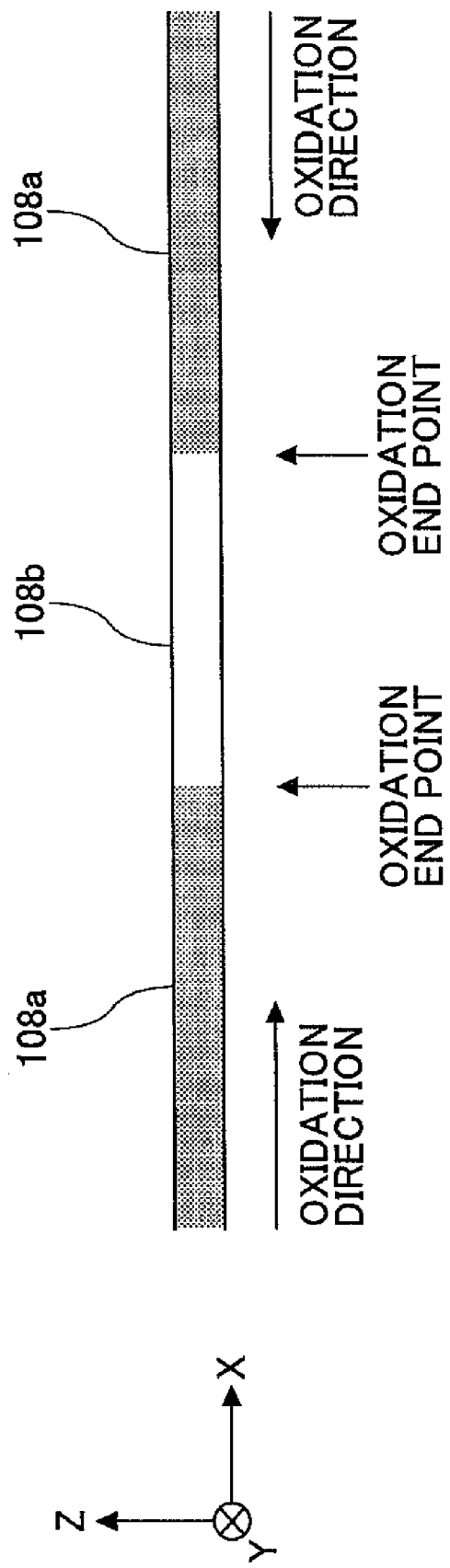

FIG.11B

| DISTANCE (nm) FROM OXIDATION END POINT IN X-AXIS DIRECTION | 10.1 | 8 | 5.5 | 3 | 2 | 1 | 0.5 | 0.2 |
|---|---|---|---|---|---|---|---|---|
| Sx1 (nm) | 93.7 | 85.2 | 73.3 | 60.1 | 55 | 53 | 45.4 | 43.5 |
| Sx2 (nm) | 94.5 | 85.7 | 70.2 | 58.3 | 54.2 | 52.5 | 45.2 | 43.2 |
| Sx1-Sx2 (nm) | -0.8 | -0.5 | 3.1 | 1.8 | 0.8 | 0.5 | 0.2 | 0.3 |

FIG.11C

| DISTANCE (nm) FROM OXIDATION END POINT | 10.1 | 8 | 5.5 | 3 | 2 | 1 | 0.5 | 0.2 |
|---|---|---|---|---|---|---|---|---|
| Sy1 (nm) | 116.4 | 99.4 | 80.4 | 64.9 | 59.5 | 54.9 | 47.4 | 45.2 |
| Sx1 (nm) | 93.7 | 85.2 | 73.3 | 60.1 | 55 | 53 | 45.4 | 43.5 |
| Sy1-Sx1 (nm) | 22.7 | 14.2 | 7.1 | 4.8 | 4.5 | 1.9 | 2 | 1.7 |

SURFACE-EMITTING LASER, SURFACE-EMITTING LASER ARRAY, OPTICAL SCANNING DEVICE, AND IMAGE FORMING APPARATUS

BACKGROUND

1. Technical Field

This disclosure relates to a surface-emitting laser, a surface-emitting laser array, an optical scanning device including the surface-emitting laser or the surface-emitting laser array, and an image forming apparatus including the optical scanning device.

2. Description of the Related Art

Image forming apparatuses including a laser as a light source are widely used for electrophotographic recording. A typical image forming apparatus for electrophotographic recording includes an optical scanning device that scans the surface of a photosensitive drum with a light beam emitted from a light source and deflected by a deflector to form a latent image on the surface of the photosensitive drum.

Such an optical scanning device includes an optical system including a scanning lens. If the polarization state of light entering the optical system is unstable, the quality of an image output from the image forming apparatus may be degraded.

To prevent or reduce this problem, various methods for controlling the polarization state of light emitted from a surface-emitting laser have been proposed. In a first method, which is expected to be the most promising method, an inclined substrate is used (see, for example, patent document 1 and non-patent document 1).

In a second method, anisotropic stress is applied to the active layer (see, for example, patent documents 2 and 3).

In a third method, a selective oxidation layer having a rectangular or oval shape is used (see, for example, patent documents 4 through 6). In a fourth method, a selective oxidation layer with uneven thickness is used (see, for example, patent document 7).

However, the first method lacks stability. With the first method, for example, the polarization state of light becomes unstable when the temperature of the laser becomes high or the laser is operated for a long period of time. With the second method, the directions in which wires can be pulled out are limited and isotropic dry etching cannot be used for mesa formation. This in turn increases the costs of the laser. The third method adversely affects the shape (cross-sectional shape) of a light beam. With the fourth method, metal organic chemical vapor deposition (MOCVD) cannot be used for the production of the laser. This in turn increases the production costs.

[Patent document 1] Japanese Patent No. 4010095
[Patent document 2] Japanese Patent No. 3606059
[Patent document 3] Japanese Patent Application Publication No. 2006-13366
[Patent document 4] Japanese Patent No. 3799667
[Patent document 5] Japanese Patent No. 3551718
[Patent document 6] Japanese Patent No. 2891133
[Patent document 7] Japanese Patent No. 3800852
[Non-patent document 1] T. Ohtosh, T. Kuroda, A. Niwa, and S. Tsuji; "Dependence of optical gain on crystal orientation in surface-emitting lasers with strained quantum wells", Appl. Phys. Lett. 65(15), 10, October 1994

BRIEF SUMMARY

Various aspects of this disclosure can be included in a surface-emitting laser, a surface-emitting laser array, an optical scanning device including the surface-emitting laser or the surface-emitting laser array, and an image forming apparatus including the optical scanning device.

For example, in an aspect of this disclosure, a surface-emitting laser includes a substrate and multiple semiconductor layers stacked on the substrate, and is configured to emit light in a direction perpendicular to the substrate. A normal of a principal plane of the substrate is inclined with respect to one of crystal orientations <1 0 0> toward one of crystal orientations <1 1 1>. The semiconductor layers include a resonator structure including an active layer; and a semiconductor multilayer mirror stacked on the resonator structure and including a confined structure where a current passage area is surrounded by an oxidized area including at least an oxide generated by oxidation of a part of a selective oxidation layer containing aluminum. A strain field caused by the oxidation is present at least in a part of the vicinity of the oxidized area surrounding the current passage area. In the strain field, the amount of strain in a first axis direction parallel to a surface of the substrate and orthogonal to both the one of crystal orientations <1 0 0> and the one of crystal orientations <1 1 1> is different from the amount of strain in a second axis direction orthogonal to both the normal and the first axis direction.

BRIEF DESCRIPTION OF THE DRAWINGS

FIGS. 4A and 4B are drawings illustrating a substrate shown in FIG. 3;

FIG. 5 is an enlarged view of a part around an active layer shown in FIG. 3;

FIG. 10B is a table showing exemplary values of Sy1 and Sy2;

FIG. 11A is a cross-sectional view of an oxide-confined structure taken along line B-B of FIG. 7;

FIG. 11B is a table showing exemplary values of Sx1 and Sx2;

FIG. 11C is a table showing exemplary values of Sy1 and Sx1;

DESCRIPTION OF THE PREFERRED EMBODIMENTS

Preferred embodiments of the present invention are described below with reference to the accompanying drawings.

Figure 1:
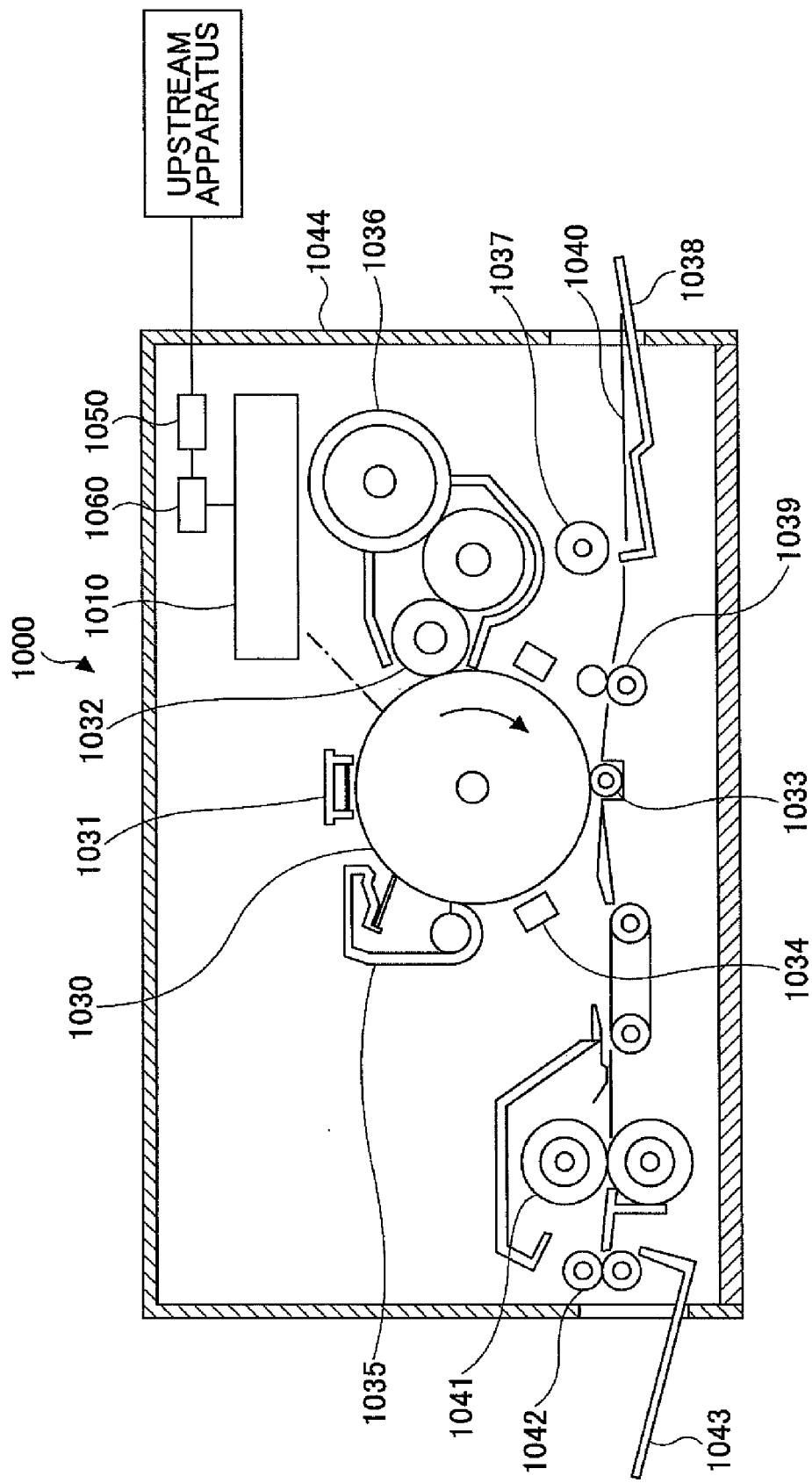
FIG. 1 is a schematic diagram illustrating a configuration of a laser printer according to an embodiment of the present invention.

FIG. 1 is a schematic diagram illustrating a configuration of a laser printer 1000 according to an embodiment of the present invention.

The laser printer 1000 includes an optical scanning device 1010, a photosensitive drum 1030, a charger 1031, a developing roller 1032, a transfer charger 1033, a discharge unit 1034, a cleaning unit 1035, a toner cartridge 1036, a paper-feed roller 1037, a paper-feed tray 1038, a resist-roller pair 1039, a fusing roller 1041, a paper-eject roller 1042, a paper-catch tray 1043, a communication control unit 1050, and a printer control unit 1060 for controlling other components. These components are placed in the corresponding positions in a printer case 1044.

The communication control unit 1050 controls two-way communications with an upstream apparatus (e.g., a personal computer) via, for example, a network.

The photosensitive drum 1030 is shaped like a cylinder and its surface is covered by a photosensitive layer that is to be scanned by a light beam. The photosensitive drum 1030 is configured to rotate in the direction of the arrow shown in FIG. 1.

The charger 1031, the developing roller 1032, the transfer charger 1033, the discharge unit 1034, and the cleaning unit 1034 are positioned close to the surface of the photosensitive drum 1030 and are arranged along the rotational direction of the photosensitive drum 1030 in the order mentioned above.

The charger 1031 uniformly charges the surface of the photosensitive drum 1030.

The optical scanning device 1010 irradiates the surface of the photosensitive drum 1030 charged by the charger 1031 with a light beam that is modulated according to image information from an upstream apparatus. As a result, a latent image corresponding to the image information is formed on the surface of the photosensitive drum 1030. The formed latent image moves toward the developing roller 1032 as the photosensitive drum 1030 rotates. The configuration of the optical scanning device 1010 is described later.

The toner cartridge 1036 contains toner and supplies the toner to the developing roller 1032.

The developing roller 1032 causes the toner supplied from the toner cartridge 1036 to adhere to the latent image formed on the photosensitive drum 1030 and thereby develops the latent image. The developed latent image (hereafter called a toner image) moves toward the transfer charger 1033 as the photosensitive drum 1030 rotates.

The paper-feed tray 1038 holds recording paper sheets 1040. The paper-feed roller 1037 is positioned close to the paper-feed tray 1038 and feeds the recording paper sheets 1040 one by one from the paper-feed tray 1038 to the resist-roller pair 1039. The resist-roller pair 1039 temporarily holds the recording paper sheet 1040 fed from the paper-feed roller 1037 and feeds the paper sheet 1040 into a gap between the photosensitive drum 1030 and the transfer charger 1033 in accordance with the rotation of the photosensitive drum 1030.

A voltage with a polarity opposite to that of the toner is applied to the transfer charger 1033 to electrically attract the toner on the photosensitive drum 1030 to the recording paper sheet 1040. In other words, the voltage causes the toner image on the photosensitive drum 1030 to be transferred onto the recording paper sheet 1040. The recording paper sheet 1040 with the transferred image is conveyed to the fusing roller 1041.

The fusing roller 1041 applies heat and pressure to the recording paper sheet 1040 and thereby fuses the toner image onto the recording paper sheet 1040. Then, the recording paper sheet 1040 is ejected by the paper-eject roller 1042 and stacked on the paper-catch tray 1043.

The discharge unit 1034 discharges the surface of the photosensitive drum 1030.

The cleaning unit 1035 removes toner (residual toner) remaining on the surface of the photosensitive drum 1030. After the residual toner is removed, the surface of the photosensitive drum 1030 returns to the position facing the charger 1031.

An exemplary configuration of the optical scanning device 1010 is described below.

Figure 2:
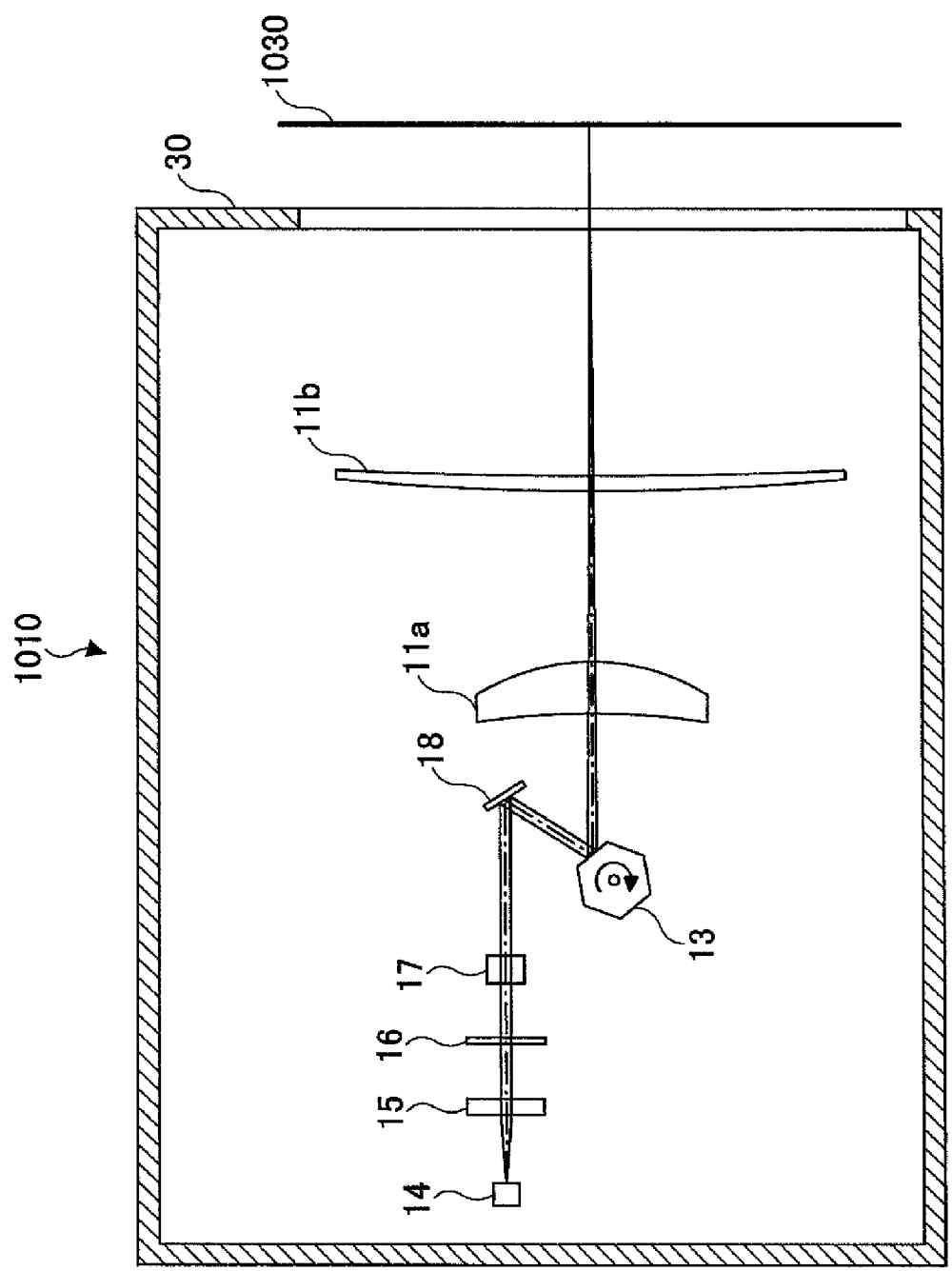
FIG. 2 is a schematic diagram illustrating an optical scanning device shown in FIG. 1.

As shown in FIG. 2, the optical scanning device 1010 includes a deflector-side scanning lens 11a, an image-surface-side scanning lens 11b, a polygon mirror 13, a light source 14, a coupling lens 15, an aperture plate 16, an anamorphic lens 17, a reflecting mirror 18, and a scan control unit (not shown). These components are placed in corresponding positions in a housing 30.

In the descriptions below, a direction corresponding to the main-scanning direction is called a "main-direction" and a direction corresponding to the sub-scanning direction is called a "sub-direction".

The coupling lens 15 substantially collimates a light beam emitted from the light source 14. The light source 14 and the coupling lens 15 are fixed to a holder made of aluminum and are thereby combined as a unit.

The aperture plate 16 has an aperture for limiting the diameter of the light beam passing through the coupling lens 15.

The anamorphic lens 17 causes the light beam passing through the aperture of the aperture plate 16 to be reflected by the reflecting mirror 18 and focused in the sub-direction near a deflecting surface of the polygon mirror 13.

The optical system disposed in an optical path between the light source 14 and the polygon mirror 13 is also called a pre-deflector optical system. In this embodiment, the pre-deflector optical system includes the coupling lens 15, the aperture plate 16, the anamorphic lens 17, and the reflecting mirror 18.

The polygon mirror 13, for example, is a six-sided mirror with an inradius of 18 mm where each of the six mirrors functions as a deflecting surface. The polygon mirror 13 deflects the light beam from the reflecting mirror 18 while rotating at a constant speed about an axis parallel to the sub-direction.

The deflector-side scanning lens 11a is disposed in a path of the light beam deflected by the polygon mirror 13.

The image-surface-side scanning lens 11b is disposed in a path of the light beam passing through the deflector-side scanning lens 11a. The light beam passing through the image-surface-side scanning lens 11b forms a light spot on the surface of the photosensitive drum 1030. The formed light spot moves in the longitudinal direction of the photosensitive drum 1030 as the polygon mirror 13 rotates. In other words, the photosensitive drum 1030 is scanned by the light spot. The direction of movement of the light spot is the main-scanning direction, and the direction of rotation of the photosensitive drum 1030 is the sub-scanning direction.

The optical system disposed in an optical path between the polygon mirror 13 and the photosensitive drum 1030 is also called a scanning optical system. In this embodiment, the scanning optical system includes the deflector-side scanning lens 11a and the image-surface-side scanning lens 11b. Also, one or more bending mirrors may be provided in an optical path between the deflector-side scanning lens 11a and the image-surface-side scanning lens 11b and/or an optical path between the image-surface-side scanning lens 11b and the photosensitive drum 1030.

Figure 3:
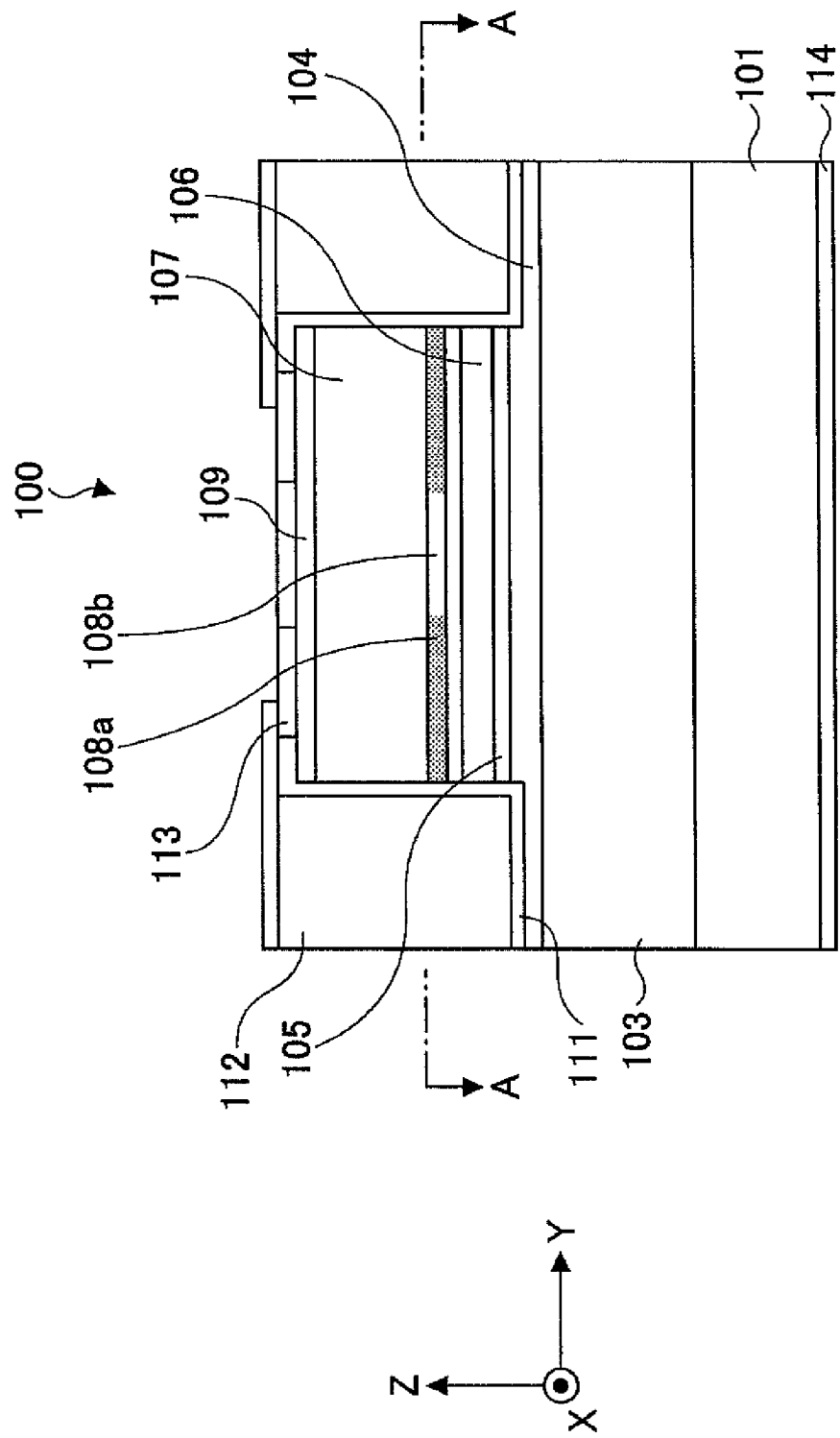
FIG. 3 is a drawing illustrating a surface-emitting laser of a light source shown in FIG. 2.

The light source 14 includes a surface-emitting laser 100 as exemplified in FIG. 3. In the present application, the laser oscillation direction is called a Z-axis direction, and two orthogonal directions in a plane perpendicular to the Z-axis direction are called an X-axis direction and a Y-axis direction.

The surface-emitting laser 100 has a design oscillation wavelength in a 780-nm band and includes a substrate 101, a lower semiconductor DBR 103, a lower spacer layer 104, an active layer 105, an upper spacer layer 106, an upper semiconductor DBR (semiconductor multilayer mirror) 107, and a contact layer 109.

Figure 4B:
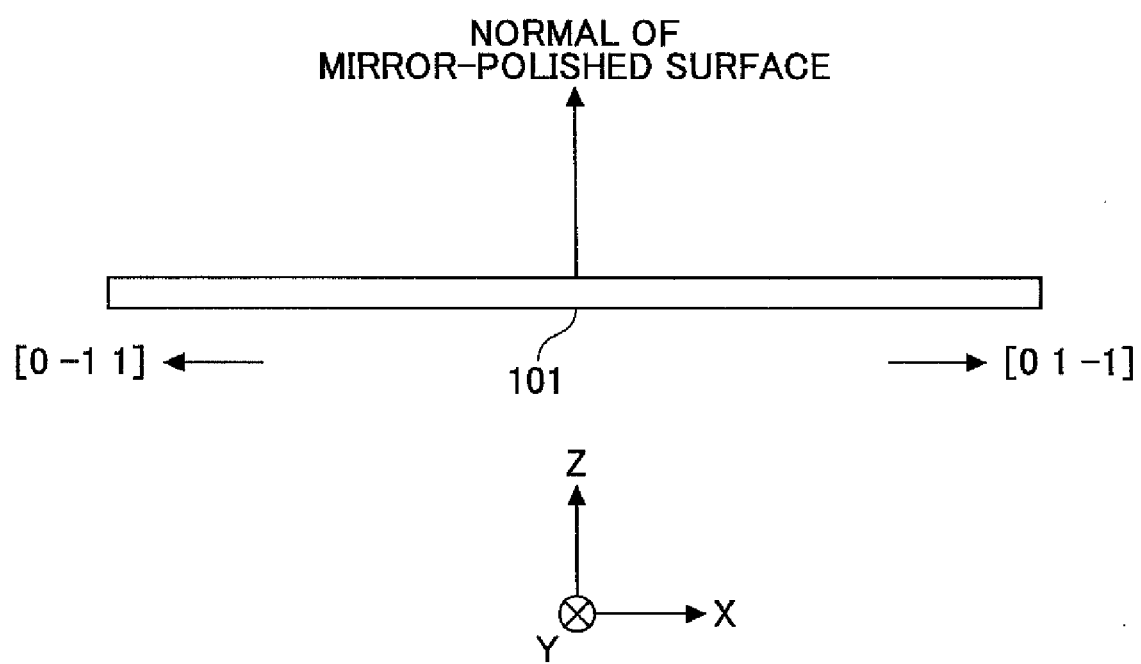

The substrate 101 is an n-GaAs single-crystal substrate having a mirror-polished surface. As shown in FIG. 4A, the normal of the mirror-polished surface is inclined 15 degrees ($\theta$=15 degrees) with respect to the crystal orientation [1 0 0] toward the crystal orientation [1 1 1]A. In other words, the substrate 101 is an inclined substrate. In this embodiment, as shown in FIG. 4B, the substrate 101 is positioned such that the crystal orientation [0 1 –1] corresponds to the +X direction and the crystal orientation [0 –1 1] corresponds to the –X direction. Also, it is assumed that the X-axis direction is the desired polarization direction.

The lower semiconductor DBR 103 is stacked above the +Z side of the substrate 101 via a buffer layer (not shown) and includes 40.5 pairs of a low-refractive-index layer 103a essentially composed of n-AlAs and a high-refractive-index layer 103b essentially composed of n-$Al_{0.3}Ga_{0.7}As$. Between each pair of the refractive-index layers, a composition gradient layer (not shown) having gradually changing composition and a thickness of 20 nm is provided to reduce electric resistance. The combined optical thickness of each of the refractive-index layers and one half of the adjoining composition gradient layer is $\lambda/4$ where $\lambda$ indicates the oscillation wavelength. When the optical thickness of a layer is $\lambda/4$, the actual thickness of the layer is $\lambda/4N$ where N indicates the refractive index of the medium of the layer.

The lower spacer layer 104 is stacked on the +Z side of the lower semiconductor DBR 103 and is essentially composed of undoped $(Al_{0.1}Ga_{0.9})_{0.5}In_{0.5}P$.

The active layer 105 is stacked on the +Z side of the lower spacer layer 104 and as exemplified in FIG. 5, includes three quantum well layers 105a and four barrier layers 105b. Each of the quantum well layers 105a is essentially composed of GaInPAs that induces compressive strain of 0.7% and has a band-gap wavelength of about 780 nm. Each of the barrier layers 105b is essentially composed of $Ga_{0.68}In_{0.32}P$ that induces tensile strain of 0.6%.

As the strain increases, the band dispersion of heavy holes and light holes increases. This in turn increases the gain, reduces the threshold, and increases the efficiency (increases the power). This also improves the carrier confinement capability and reduces the threshold, and thereby makes it possible to reduce the reflectance of the upper semiconductor DBR 107, which results in further increase in the power.

The upper spacer layer 106 is stacked on the +Z side of the active layer 105 and is essentially composed of undoped $(Al_{0.1}Ga_{0.9})_{0.5}In_{0.5}P$.

The lower spacer layer 104, the active layer 105, and the upper spacer layer 106 form a resonator structure having an optical thickness of one wavelength. The active layer 105 is positioned in the middle of the resonator structure which corresponds to the peak of electric field standing wave distribution to achieve a high stimulated emission probability.

The upper semiconductor DBR 107 is stacked on the +Z side of the upper spacer layer 106 and includes 23 pairs of a low-refractive-index layer and a high-refractive-index layer. Between each pair of the refractive-index layers, a composition gradient layer (not shown) having gradually changing composition is provided to reduce electric resistance.

Figure 6:
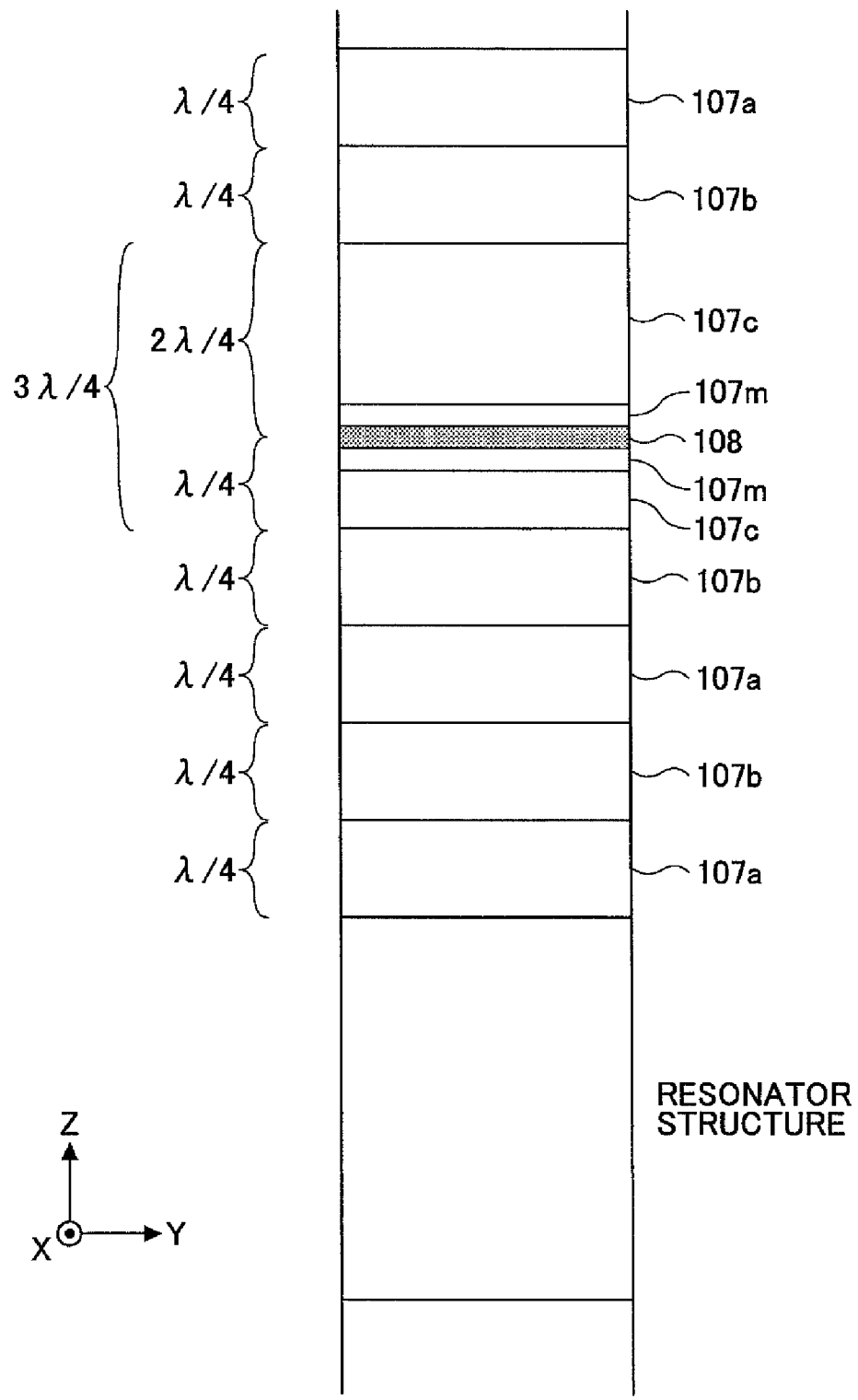
FIG. 6 is an enlarged view of a part of an upper semiconductor DBR shown in FIG. 3.

As exemplified in FIG. 6, a selective oxidation layer 108 essentially composed of p-AlAs and having a uniform thickness of 30 nm is inserted in one of the low-refractive-index layers of the upper semiconductor DBR 107. The selective oxidation layer 108 is inserted into a third low-refractive-index layer from the upper spacer layer 106 which is at an optical distance of $5\lambda/4$ from the upper spacer layer 106. The combined optical thickness of the low-refractive-index layer including the selective oxidation layer 108 and one half of the adjoining composition gradient layer is $3\lambda/4$.

Meanwhile, the combined optical thickness of each refractive-index layer of the upper semiconductor DBR 107 other than the low-refractive-index layer including the selective oxidation layer 108 and one half of the adjoining composition gradient layer is $\lambda/4$.

Also as exemplified in FIG. 6, intermediate layers 107m essentially composed of p-$Al_{0.81}Ga_{0.19}As$ and having a thickness of 38 nm are provided on the –Z and +Z sides of the selective oxidation layer 108.

As shown in FIG. 6, the low-refractive layer including the selective oxidation layer 108 further includes layers 107c (hereafter called low-refractive layers 107c) composed essentially of p-$Al_{0.7}Ga_{0.3}As$ and positioned adjacent to the intermediate layers 107m.

In the upper semiconductor DBR 107, 107a indicates low-refractive-index layers other than the low-refractive-index layer including the selective oxidation layer 108. The low-refractive-index layers 107a are essentially composed of p-$Al_{0.9}Ga_{0.1}As$. Also in the upper semiconductor DBR 107, 107b indicates high-refractive-index layers. The high-refractive-index layers 107b are essentially composed of p-$Al_{0.3}Ga_{0.7}As$.

The contact layer 109 is stacked on the +Z side of the upper semiconductor DBR 107 and is essentially composed of p-GaAs.

Hereafter, a structure made by stacking multiple semiconductor layers on the substrate 101 as described above is called a "laminated structure".

An exemplary method of producing the surface-emitting laser 100 is outlined below.

(1) A laminated structure as described above is produced by growing crystals by metal-organic chemical vapor deposition (MOCVD) or molecular beam epitaxy (MBE).

In this example, trimethylaluminum (TMA), trimethylgallium (TMG), and trimethylindium (TMI) are used as group III materials, and phosphine ($PH_3$) and arsine ($AsH_3$) are used as group V materials. Also, carbon tetrabromide ($CBr_4$) and dimethyl zinc (DMZn) are used as the materials for a p-type dopant, and hydrogen selenide ($H_2Se$) is used as the material for an n-type dopant. As the carrier gas, $H_2$ is used. With the MOCVD method, it is possible to easily form a structure such as a composition gradient layer by controlling the amounts of source gases supplied. Therefore, the MOCVD method is more preferable than the MBE method as a crystal growth method for a surface-emitting laser including a semiconductor DBR. Also with the MOCVD method, it is possible to grow crystals by controlling the amounts of source gases supplied and the duration for supplying source gases without using a high vacuum as in the MBE method. Therefore, the MOCVD method is also suitable for mass production.

(2) A square resist pattern, having a side length of 20 μm, is formed on the surface of the laminated structure.

(3) A mesa shaped like a quadrangular prism is formed by ECR etching employing a $Cl_2$ gas using the square resist pattern as a photomask. In this example, the etching is stopped in the lower spacer layer 104 (see FIG. 3). The size of the mesa (the length of one side) is preferably greater than or equal to 10 μm. If the mesa is too small, heat generated during operation is trapped and the characteristics of the laser may be degraded.

(4) The photomask is removed.

(5) The laminated structure is heat-treated by water vapor. In this example, it is assumed that the temperature of a stage where the laminated structure is placed is 380° C. and the oxidation time is 37 minutes. With the heat treatment, aluminum (Al) in the selective oxidation layer 108 is selectively oxidized from the circumferential surface of the mesa, and as a result, an unoxidized area 108b surrounded by an oxidized layer (oxidized area) 108a of Al is left in the center of the mesa (see FIG. 3). In other words, an oxide-confined structure where a path for a light emitter drive current is confined in the central portion of the mesa is formed. That is, the unoxidized area 108b functions as a current passage area (current injection area).

(6) A protective layer 111 essentially composed of SiN or $SiO_2$ is formed by chemical vapor deposition (CVD) (see FIG. 3).

(7) The laminated structure is planarized with polyimide 112 (see FIG. 3).

(8) An opening for a p-electrode 113 is formed in the upper side of the mesa. In this example, a photoresist is formed on the upper side of the mesa and a portion of the photoresist corresponding to an opening to be formed is removed by light exposure. Then, the protective layer 111 is etched with BHF to form the opening.

(9) A square resist pattern, having a side length of 10 μm, is formed on an area of the upper side of the mesa to be used as a light output portion, and a material for the p-electrode 113 is deposited. As the material for the p-electrode 113, a multilayer film composed of Cr, AuZn, and Au or a multilayer film composed of Ti, Pt, and Au may be used.

(10) The electrode material on the light output portion is lifted off to form the p-electrode 113 (see FIG. 3).

(11) The lower surface of the substrate 101 is ground to a predetermined thickness (e.g., about 100 μm), and then an n-electrode 114 is formed (see FIG. 3). In this example, a multilayer film composed of AuGe, Ni, and Au is used for the n-electrode 114.

(12) Ohmic conduction between the p-electrode 113 and the n-electrode 114 is achieved by annealing. As a result, the mesa becomes a light emitter.

(13) Then, the laminated structure where multiple surface-emitting lasers 100 are formed is diced into chips.

In a test, the surface-emitting laser 100 produced as described above emitted linearly polarized light and the polarization direction of the light was stable in the X-axis direction as desired. The shape (far-field pattern: FFP) of the light beam emitted from the surface-emitting laser 100 was substantially circular.

Figure 7:
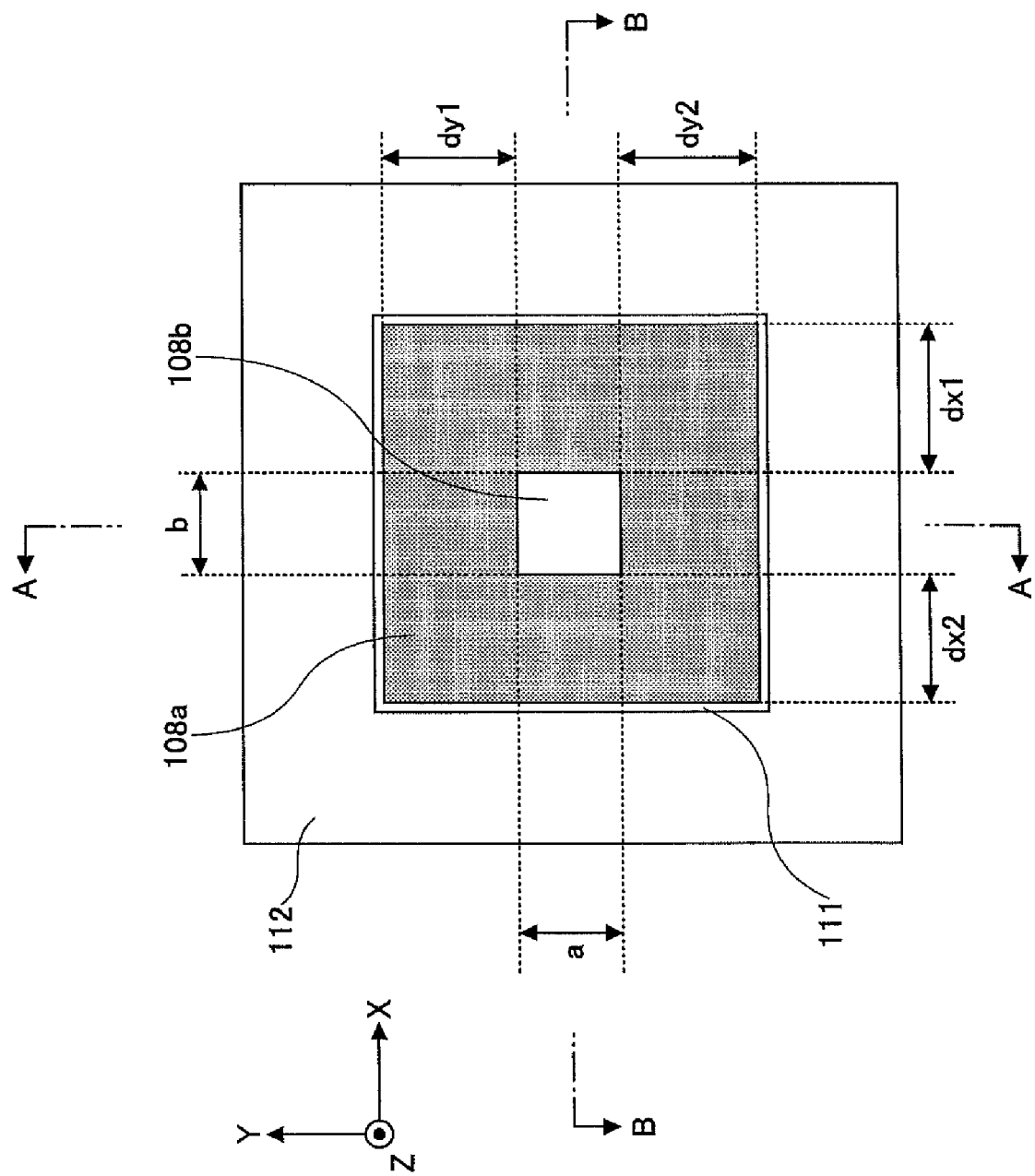
FIG. 7 is a cross-sectional view of a surface-emitting laser taken along line A-A of FIG. 3.
Figure 8:
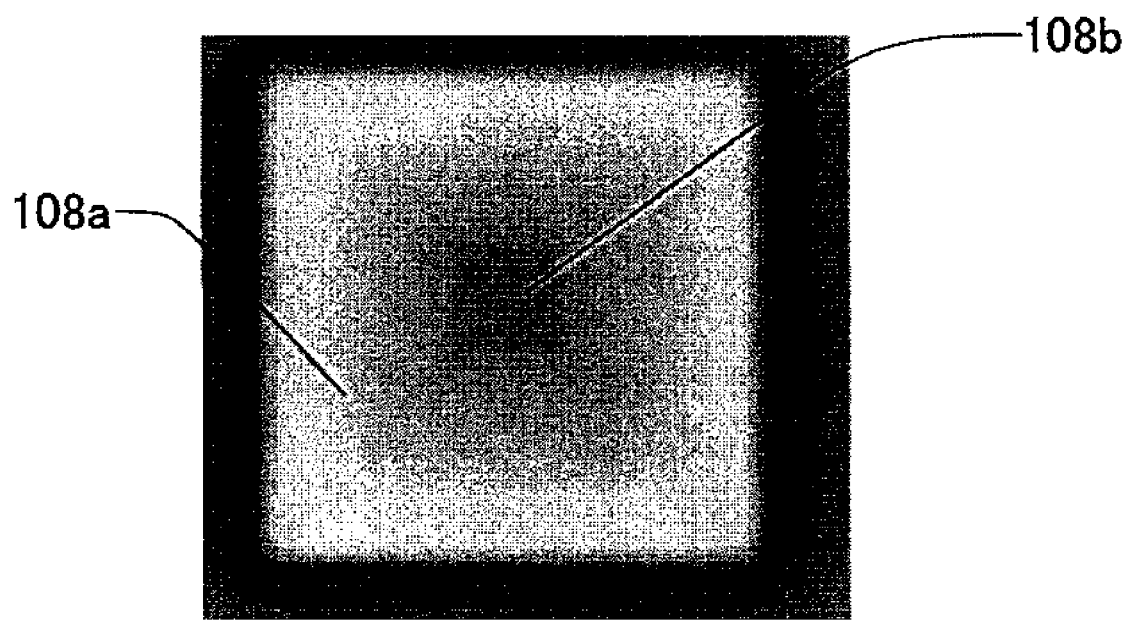
FIG. 8 is a drawing illustrating an oxidized layer and a current passage area observed by an IR microscope.

FIG. 7 is a cross-sectional view of the surface-emitting laser 100 taken along line A-A of FIG. 3. In FIG. 7, dy1 indicates the distance between the +Y end of the oxidized layer 108a and the +Y end of the current passage area 108b, dy2 indicates the distance between the −Y end of the oxidized layer 108a and the −Y end of the current passage area 108b; dx1 indicates the distance between the +X end of the oxidized layer 108a and the +X end of the current passage area 108b; and dx2 indicates the distance between the −X end of the oxidized layer 108a and the −X end of the current passage area 108b. The distances were measured using an IR microscope and the measurement results showed that dy2>dy1 and dx2≈dx1>dy1.

Here, dy1 corresponds to the length of oxidation (oxidation length or distance) proceeded in the −Y direction, dy2 corresponds to the length of oxidation proceeded in the +Y direction, dx1 corresponds to the length of oxidation proceeded in the −X direction, and dx2 corresponds to the length of oxidation proceeded in the +X direction. Since the oxidation time is constant, the oxidation length increases as the oxidation rate increases. Therefore, the above measurement results indicate that the oxidation rate in the −Y direction is slower than the oxidation rates in the +Y, +X, and −X directions.

Also, according to the measurement results, dy1/dx1 (oxidation rate ratio) was 0.95.

Figure 9:
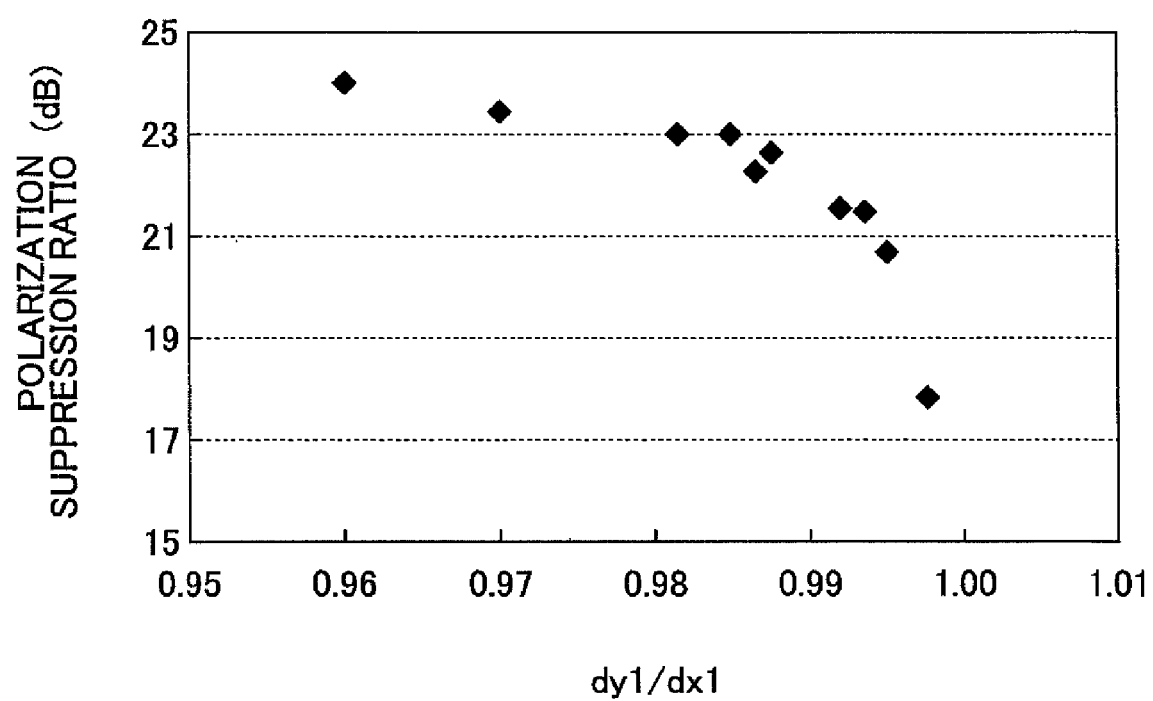
FIG. 9 is a graph showing a relationship between an oxidation rate ratio and a polarization suppression ratio.

FIG. 9 shows a relationship between the oxidation rate ratio and the polarization suppression ratio measured in an experiment where only oxidation conditions were changed. The polarization suppression ratio is the ratio of the intensity of light in the desired polarization direction to the intensity of light in a direction orthogonal to the desired polarization direction. For example, a polarization suppression ratio of about 20 dB is normally required for a copier. As shown in FIG. 9, the oxidation rate ratio was gradually increased from 0.95. The polarization suppression ratio started to decrease when the oxidation rate ratio reached about 0.98, and became smaller than 20 dB when the oxidation rate ratio reached 0.995. When the oxidation rate ratio was greater than or equal to 0.995, the polarization state was very unstable and the polarization direction rotated when the heat generated or the operating time reached a certain value. The polarization suppression ratio of the surface-emitting laser 100 of this embodiment was greater than or equal to 20 dB.

Figure 10A:
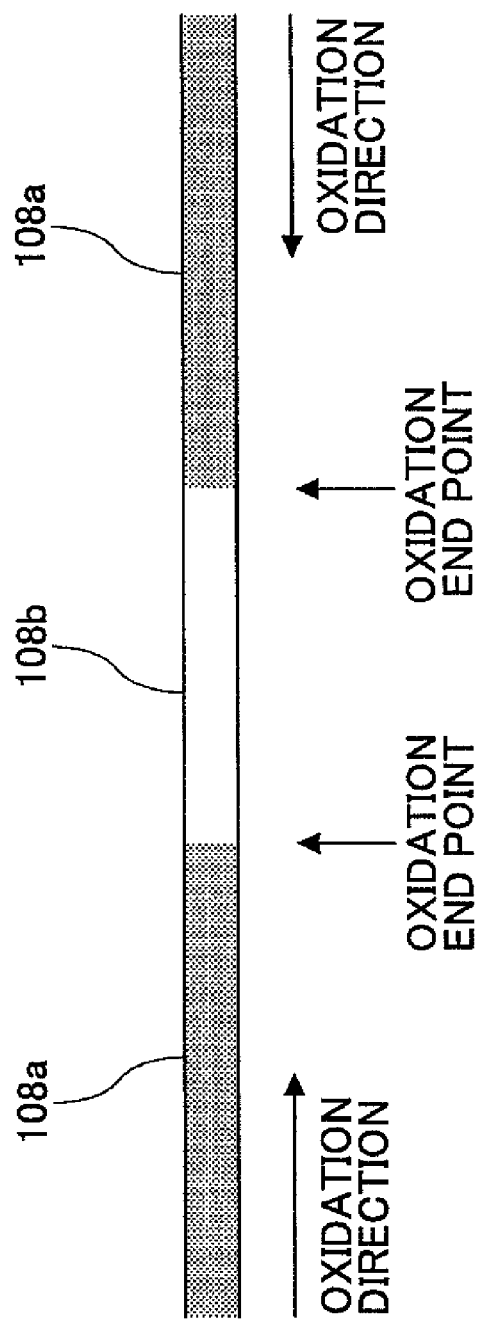
FIG. 10A is a cross-sectional view of an oxide-confined structure taken along line A-A of FIG. 7.

FIG. 10A is a cross-sectional view of the oxide-confined structure taken along line A-A of FIG. 7. A cross section of the oxidized layer 108a was observed by a transmission electron microscope (TEM). According to the observation result, the cross section of the oxidized layer 108a gently slopes downward in the direction of the oxidation process. In FIG. 10B, Sy1 indicates the thickness of the oxidized layer 108a on the +Y side of the current passage area 108b and Sy2 indicates the thickness of the oxidized layer 108a on the −Y side of the current passage area 108b. The thicknesses Sy1 and Sy2 were measured at various positions along the Y-axis. As shown in FIG. 10B, Sy1 was greater than Sy2 at the same distance from the corresponding oxidation end points.

FIG. 11A is a cross-sectional view of the oxide-confined structure taken along line B-B of FIG. 7. In FIG. 11B, Sx1 indicates the thickness of the oxidized layer 108a on the −X side of the current passage area 108b and Sx2 indicates the thickness of the oxidized layer 108a on the +X side of the current passage area 108b. The thicknesses Sx1 and Sx2 were measured at various positions along the X-axis. As shown in FIG. 11B, Sx1 and Sx2 were substantially the same at the same distance from the corresponding oxidation end points. Also, as shown in FIG. 11C, Sx1 and Sx2 were smaller than Sy1 at the same distance from the corresponding oxidation end points.

Meanwhile, formation of a strain field by the selective oxidation described above can be detected, for example, from a selected-area electron diffraction image obtained by a TEM. According to an obtained selected-area electron diffraction image of the surface-emitting laser 100 of this embodiment, the strain field caused by the selective oxidation was larger near the oxidation end points and the influence of the strain field on the active layer 105 was observed near the oxidation end points. This means that a local strain has been applied to the active layer 105 by the selective oxidation.

The inventors of the present invention measured the degree of the local strain (amount of strain) applied to the active layer 105 using a cathodoluminescence (CL) technique.

Figure 12:
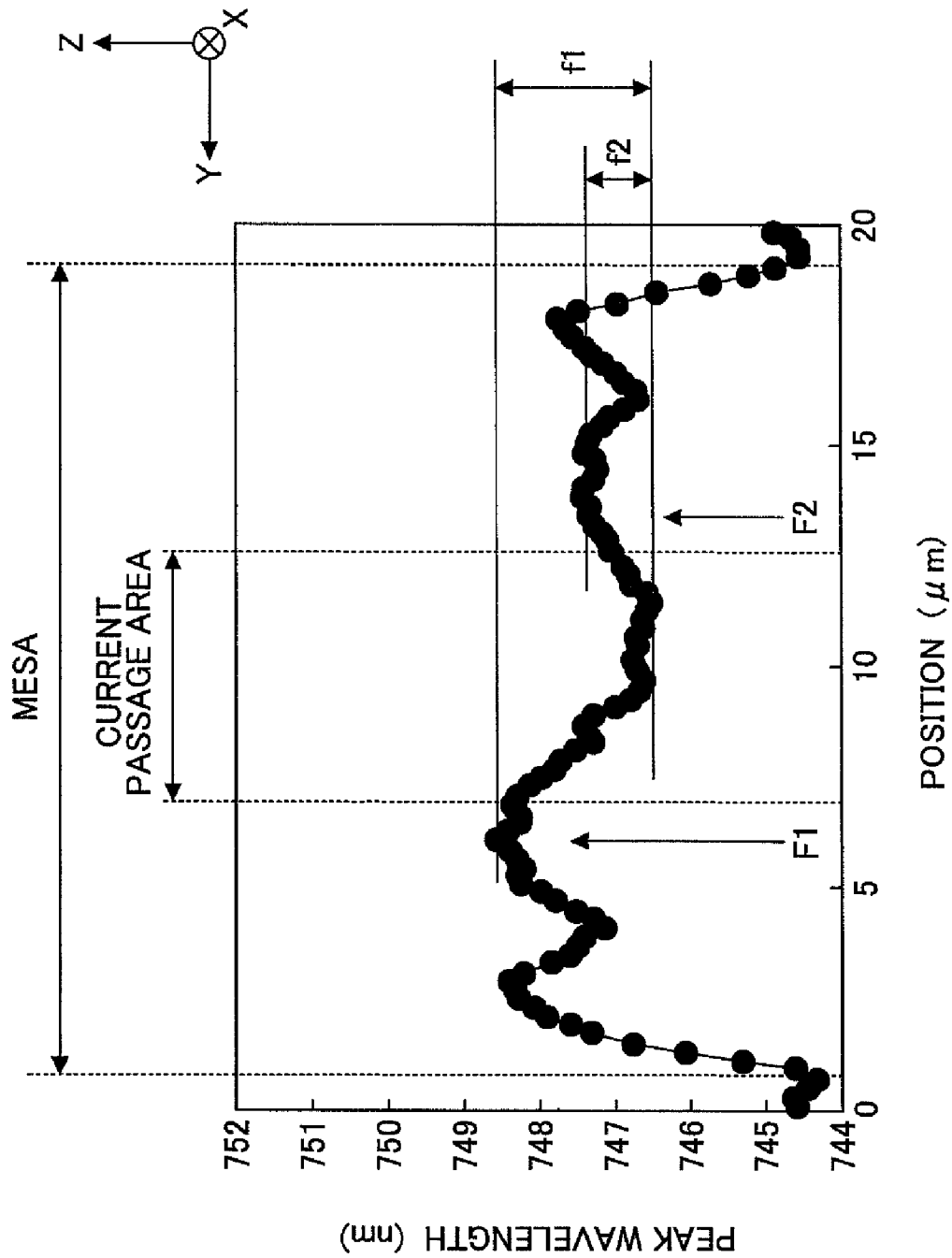
FIG. 12 is a graph showing measured peak wavelengths of cathodoluminescence in a surface-emitting laser shown in FIG. 3.

FIG. 12 is a graph showing measured peak wavelengths of cathodoluminescence in the active layer 105 of the surface-emitting laser 100 at positions along the Y-axis direction. As shown in FIG. 12, variations (hereafter called "shift amounts") of the peak wavelengths at positions (F1 and F2) corresponding to the vicinity of the oxidation end points with respect to the peak wavelengths in an area corresponding to the current passage area 108b are positive. This indicates that tensile stress is present at the positions F1 and F2. Also, a shift amount f1 at the position F1 on the +Y side is greater than a shift amount f2 at the position F2 on the −Y side. In other words, the tensile stress at the position F1 is greater than that at the position F2. It is considered that the difference in tensile stress is caused by the difference between Sy1 and Sy2 (Sy1>Sy2).

In the case of GaInAsP, a shift amount of about 1 nm in cathodoluminescence corresponds to an amount of strain of about 0.02% (see, for example, M. Watanabe, H. Matsuura, and N. Shimada; "Investigation of tensile-strained InGaAlP multiquantum-well active regions by photoluminescence measurements"; J. Appl. Phys. 76(12), 15 Dec. 1994).

In the surface-emitting laser 100 of this embodiment, the shift amount f1 at the position F1 is about 1 nm greater than the shift amount f2 at the position F2 (see FIG. 12). This indicates that a local strain with an anisotropy of about 0.02% has been applied to the active layer 105 of the surface-emitting laser 100.

Figure 13:
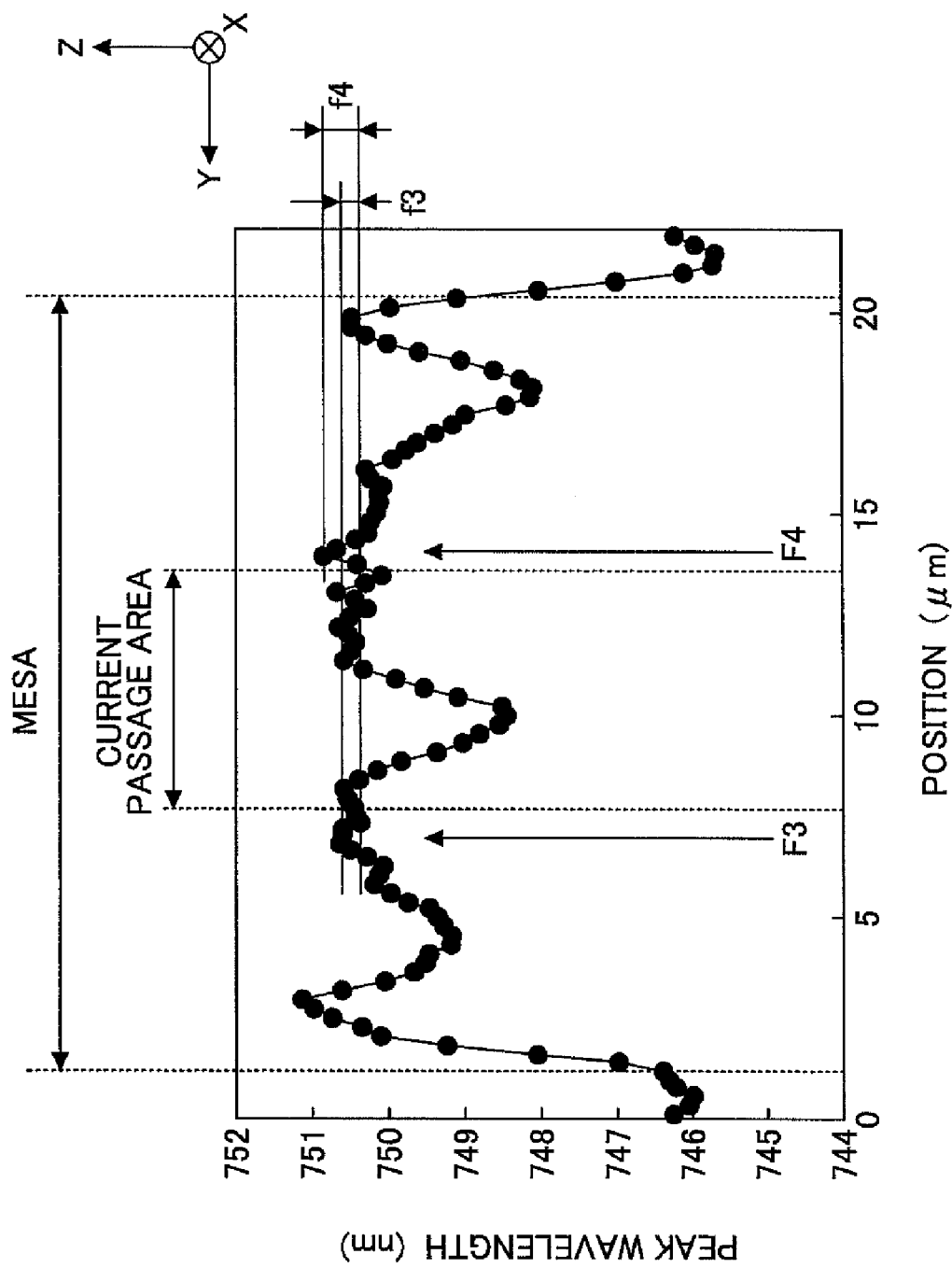
FIG. 13 is a graph showing measured peak wavelengths of cathodoluminescence in a surface-emitting laser according to comparative example 1.

FIG. 13 is a graph showing measured peak wavelengths of cathodoluminescence in a degraded surface-emitting laser according to comparative example 1. In FIG. 13, a decrease of the peak wavelength at around 10 μm is considered to be caused by the decrease in the emission intensity due to degradation and is therefore ignored. In this case, the shift amounts at positions F3 and F4 corresponding to the vicinity of the oxidation end points were substantially the same and the anisotropy of the local strain applied to the active layer was about 0.002%. The polarization state of light of the surface-emitting laser of comparative example 1 was unstable.

Figure 14:
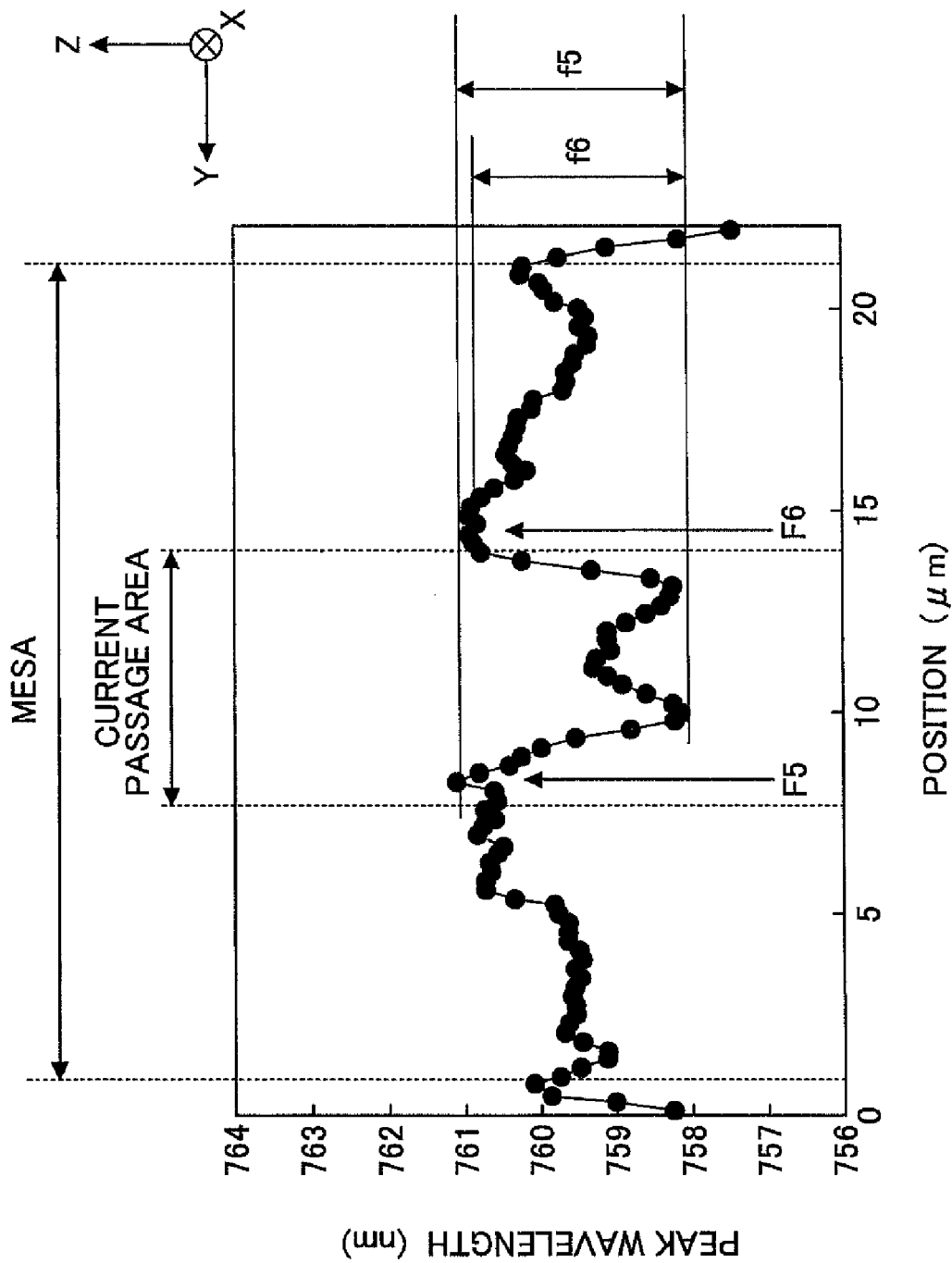
FIG. 14 is a graph showing measured peak wavelengths of cathodoluminescence in a surface-emitting laser according to comparative example 2.

FIG. 14 is a graph showing measured peak wavelengths of cathodoluminescence in a surface-emitting laser of comparative example 2 having an oxidized layer thicker than that of the surface-emitting laser 100. In this case, both of the shift amounts at positions F5 and F6 corresponding to the vicinity of the oxidation end points were about 3 nm. A shift amount of 3 nm corresponds to an amount of strain of about 0.06%. A life test was performed on the surface-emitting laser of comparative example 2 at 60° C. with the output power fixed at 1.4 mW, and the lifetime of the laser was several hundred hours. Compared with a lifetime of several thousand hours of a typical surface-emitting laser, the lifetime of the surface-emitting laser of comparative example 2 is apparently short. With a lifetime of several hundred hours, the surface-emitting laser cannot meet the requirements of an image forming apparatus. Thus, if the amount of local strain applied to an active layer of a surface-emitting laser for polarization control becomes as large as 0.06%, the lifetime of the surface-emitting laser may be reduced. Also, a similar result was obtained with a surface-emitting laser where an oxidized layer was placed closer to an active layer than in the surface-emitting laser 100.

In a typical active layer having a strained quantum well structure, the strain is compensated for by, for example, a spacer layer and is uniform in a plane. Therefore, the influence, on the lifetime, of the strain in such an active layer is measured in a different manner from a local strain as described above. The strain affecting the lifetime of a surface-emitting laser is a local strain caused by selective oxidation and therefore cannot be quantified by a typical photoluminescence technique. Quantification of such a local strain has become possible through research by the inventors of the present invention on a surface-emitting laser using a cathodoluminescence technique.

As described above, the surface-emitting laser 100 of this embodiment includes the substrate 101 the normal of a principal plane of which is inclined 15 degrees with respect to the crystal orientation [1 0 0] toward the crystal orientation [1 1 1], and a laminated structure stacked on the substrate 101. The laminated structure includes an oxide-confined structure including the oxidized layer 108a. A strain field is formed by oxidation at least in a part of the vicinity of the oxidized layer 108a. In the strain field, the amount of strain in the X-axis direction (first-axis direction) is different from the amount of strain in the Y-axis direction (second-axis direction). With this configuration, the quantum well in the active layer 105 shows optical characteristics that are the sum of the optical anisotropy caused by the substrate 101 and the optical anisotropy caused by the strain field in the vicinity of the oxidized layer 108a. This in turn makes it possible to stabilize the polarization state of a light beam without affecting the shape of the light beam and without increasing the production costs.

When an inclined substrate is used, the rate of selectively oxidizing a selective oxidation layer including Al shows in-plane anisotropy. Through various experiments, the inventors of the present invention found that the in-plane anisotropy of the oxidation rate varies greatly depending on oxidation conditions. Also, the inventors conducted detailed research on a method of accurately controlling the oxidation rate and found out oxidation conditions with which the shape of a current passage area becomes biaxially symmetric even when the oxidation rate shows in-plane anisotropy. With a current passage area having a biaxially symmetric shape, the polarization direction of an output beam tends to align with one of the two axes. In other words, it becomes easier to control the polarization of light.

The oxidation rate in a first-axis direction (here, the X-axis direction), the oxidation rate in a minus second-axis direction (here, the −Y direction), and the oxidation rate in a plus second-axis direction (here, the +Y direction) are different from each other and their order of magnitude varies depending on oxidation conditions.

Oxidized layers were formed with various oxidation conditions, and the thicknesses of the oxidized layers were measured by TEM observation, their oxidation rates (oxidation lengths) were measured by an IR microscope, and the amounts of strain were measured by a CL technique. The results revealed that regardless of the oxidation conditions, the amount of strain becomes larger and the oxidation rate becomes slower (the oxidation length becomes shorter) as the thickness of the oxidized layer increases. It is considered that if the oxidation rate is slow, the oxidation proceeds in the thickness direction and thereby increases volume shrinkage which leads to an increased amount of strain.

Figure 15:
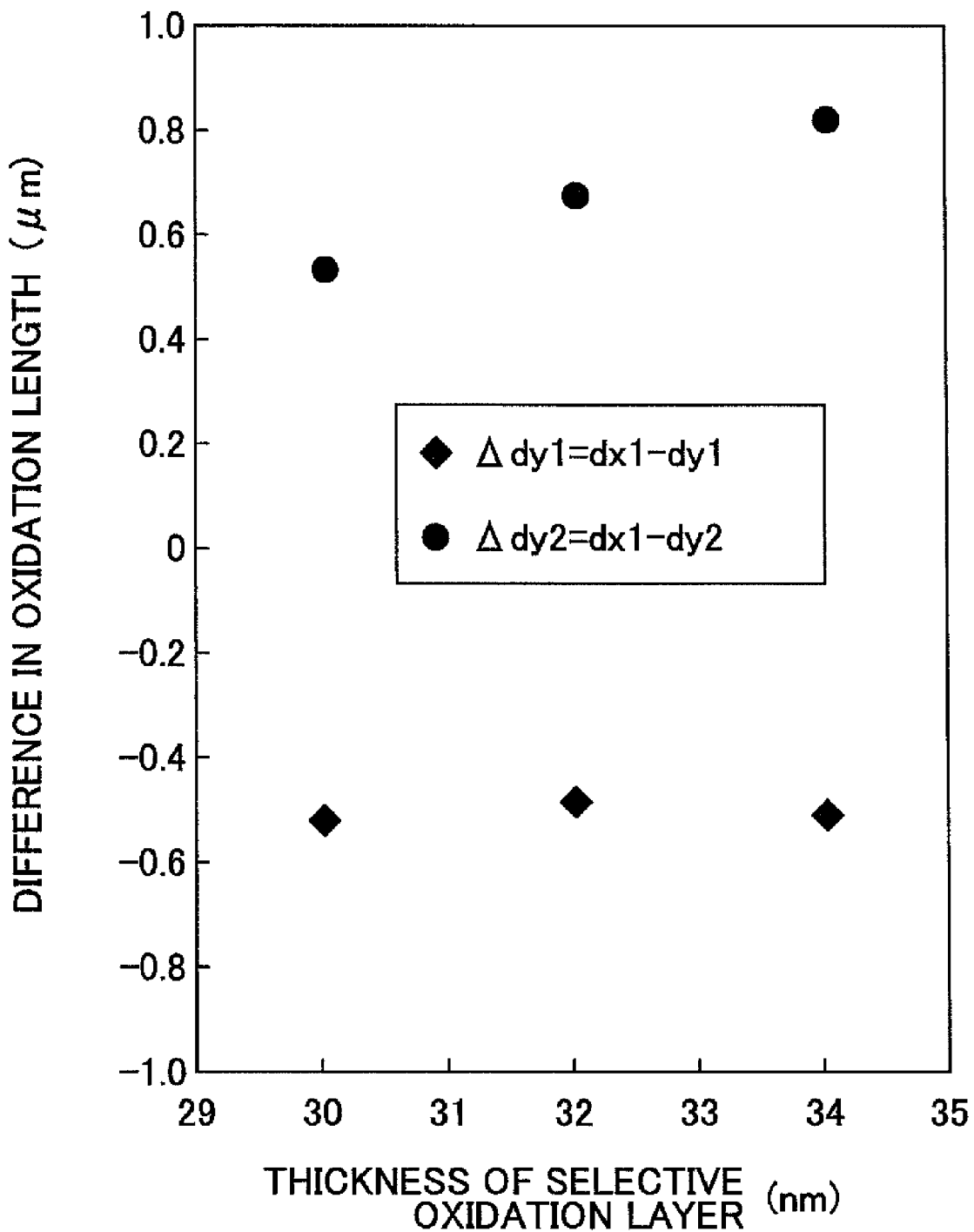
FIG. 15 is a graph showing a relationship between the difference in oxidation length and the thickness of a selective oxidation layer.

Surface-emitting lasers were prepared in substantially the same manner as the surface-emitting laser 100 except that the thickness of the selective oxidation layer was changed to 32 nm and 34 nm, respectively, and the distances dy1, dy2, dx1, and dx2 were measured. According to the measurement results, dx1 and dx2 were about 10 μm and substantially the same regardless of the thickness of the selective oxidation layer. Also, as shown in FIG. 15, dy1 was smaller than dx1 by about 0.5 μm regardless of the thickness of the selective oxidation layer. Further, it was found that the difference (Δdy2) between dx1 and dy2 increases as the thickness of the selective oxidation layer increases. This indicates that dy2 changes depending on the thickness of the selective oxidation layer. Thus, the inventors of the present invention found out that the anisotropy of oxidation rate varies depending on the thickness of the selective oxidation layer even when the oxidation conditions are constant.

The optical scanning device 1010 of this embodiment includes the light source 14 including the surface-emitting laser 100 and therefore can stably perform optical scanning.

The laser printer 1000 of this embodiment includes the optical scanning device 1010 and therefore can form a high-quality image.

Oxidation conditions applicable to the present invention are not limited to those described in step (5) of the method of producing the surface-emitting laser 100. Any oxidation conditions may be used as long as a strain field, where the amount of strain in the X-axis direction is different from the amount of strain in the Y-axis direction, can be formed by selective oxidation at least in a part of the vicinity of the oxidized layer 108*a*.

The present invention is not limited to the above embodiment where the desired polarization direction is the X-axis direction. For example, with a certain inclination direction and a certain inclination angle of the substrate 101 with respect to the {100} plane, the desired polarization direction may become the Y-axis direction.

The material of the selective oxidation layer is not limited to p-AlAs as described in the above embodiment. For example, the selective oxidation layer may also include Ga (e.g., p-Al$_{0.98}$Ga$_{0.02}$As).

The insertion point of the selective oxidation layer 108 is not limited to a position at an optical distance of 5λ/4 from the upper spacer layer 106 as in the above embodiment. For example, the selective oxidation layer 108 may be inserted into a position at an optical distance of 3λ/4 or 7λ/4 from the upper spacer layer 106.

The shape of a cross section of the mesa which is orthogonal to the laser oscillation direction is not limited to a square as in the above embodiment. For example, the cross section of the mesa may have a circular, elliptical, or rectangular shape.

In the above embodiment, the normal of a principal plane of the substrate 101 is inclined 15 degrees with respect to the crystal orientation [1 0 0] toward the crystal orientation [1 1 1]. However, the present invention is not limited to the above disclosed embodiment. The normal of a principal plane of the substrate 101 may be inclined at any angle with respect to any one of the crystal orientations <1 0 0> toward any one of the crystal orientations <1 1 1>. In any case, the oxidation conditions may be determined according to the inclination direction and angle such that the amounts of strain in the X-axis direction and the Y-axis direction become different.

Figure 16:
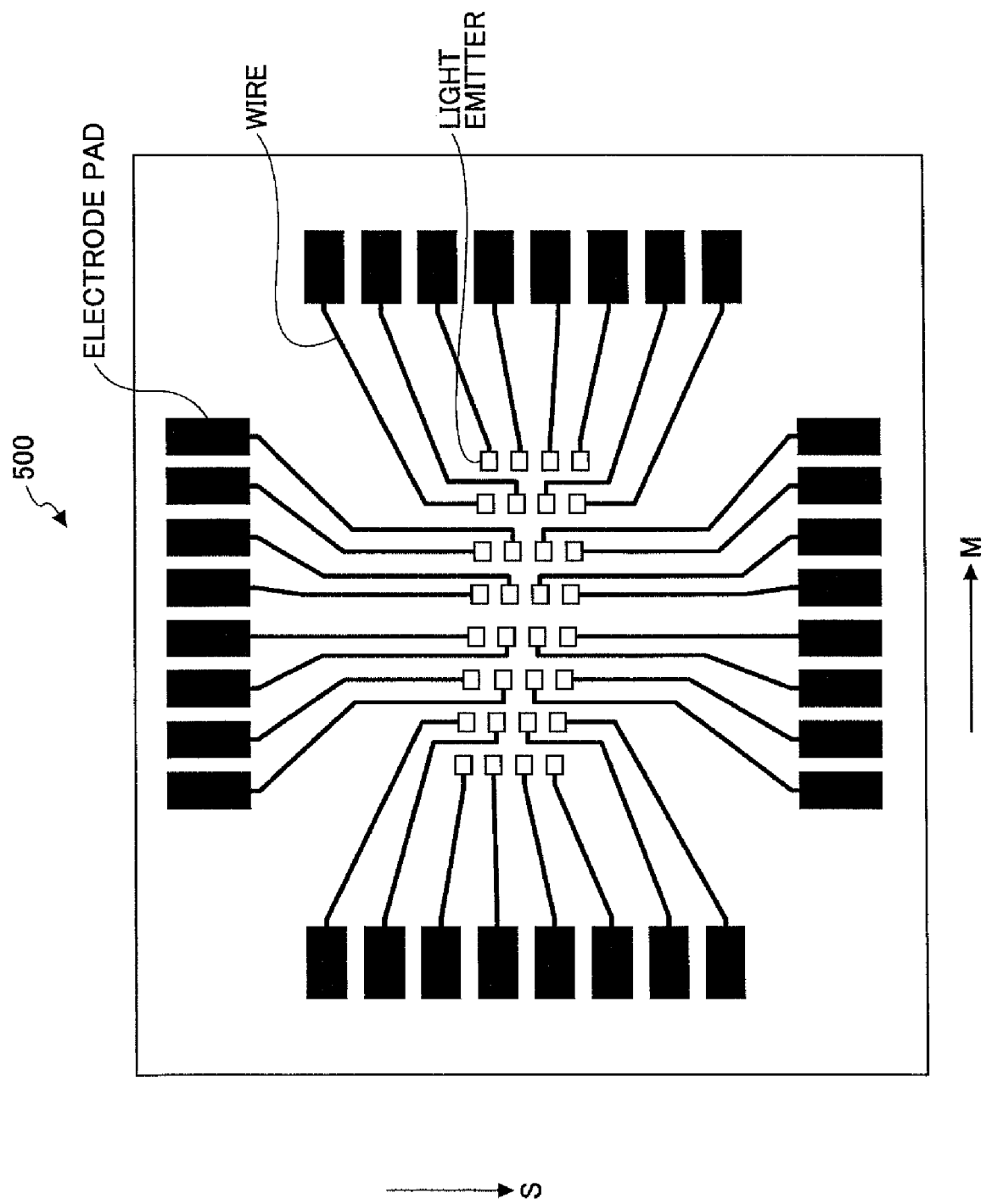
FIG. 16 is a drawing illustrating a surface-emitting laser array.

Also, the light source 14 may include a surface-emitting laser array 500 as shown in FIG. 16. instead of the surface-emitting laser 100.

In the surface-emitting laser array 500, multiple light emitters (in this example, 32 light emitters) are arranged on the same substrate. In FIG. 16, an arrow M (M direction) indicates the main-direction and an arrow S (S direction) indicates the sub-direction. The number of emitters is not limited to 32.

Figure 17:
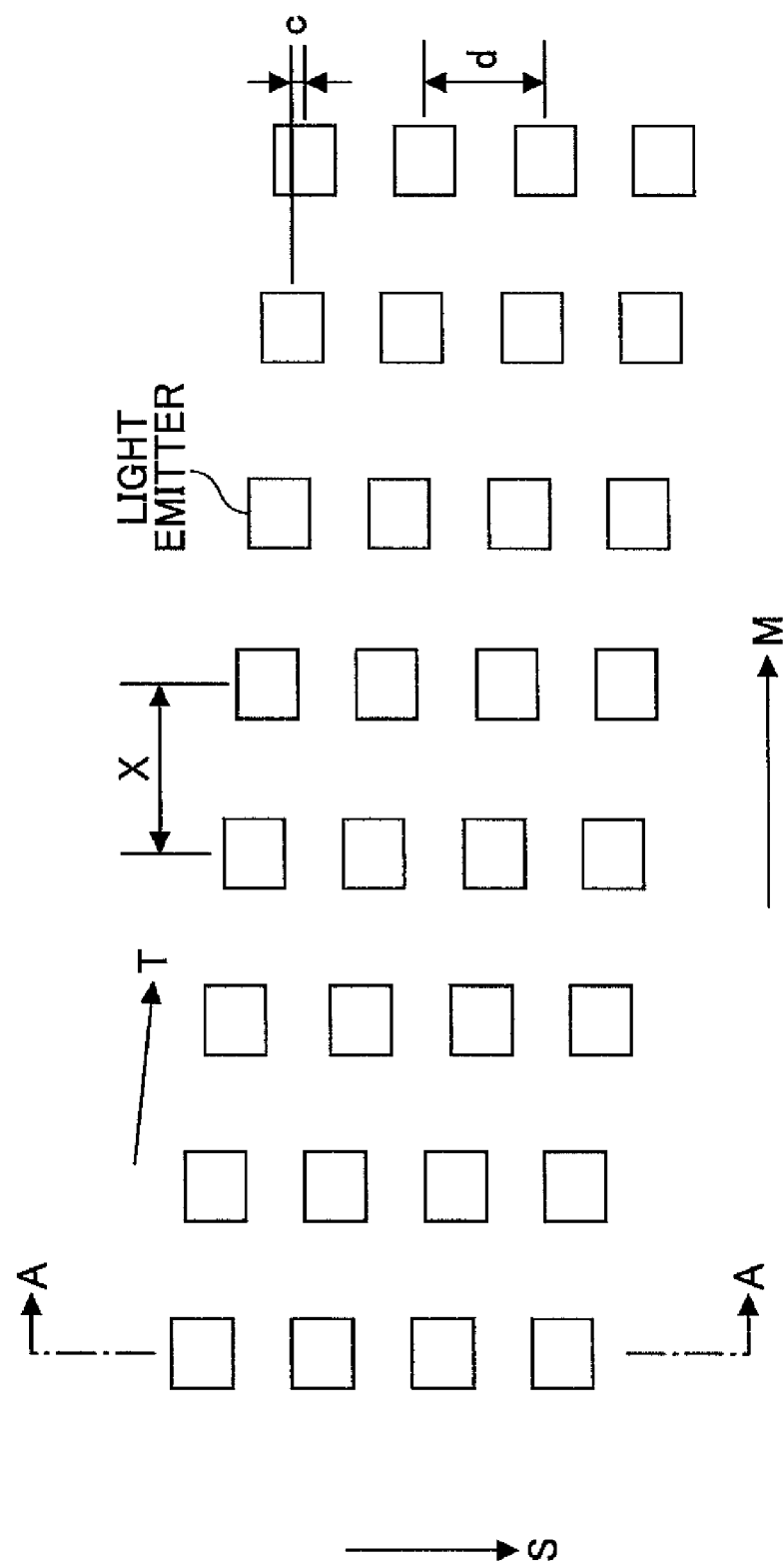
FIG. 17 is a drawing illustrating two-dimensional arrangement of light emitters shown in FIG. 16.

As shown in FIG. 17, the light emitters are arranged in four rows. In each row, eight light emitters are arranged at regular intervals along a T direction that is inclined from the M-direction toward the S direction. The four rows of light emitters are arranged at an interval d in the S direction such that if all of the light emitters are orthogonally projected on an imaginary line extending in the S direction, the projected light emitters are arranged at an interval c. Thus, the 32 light emitters are arranged two-dimensionally. In the present application, intervals between light emitters are represented by distances between the centers of the light emitters.

In this example, the interval c is 3 μm, the interval d is 24 μm, and an interval X (see FIG. 17) between the light emitters in the M direction is 30 μm.

Figure 18:
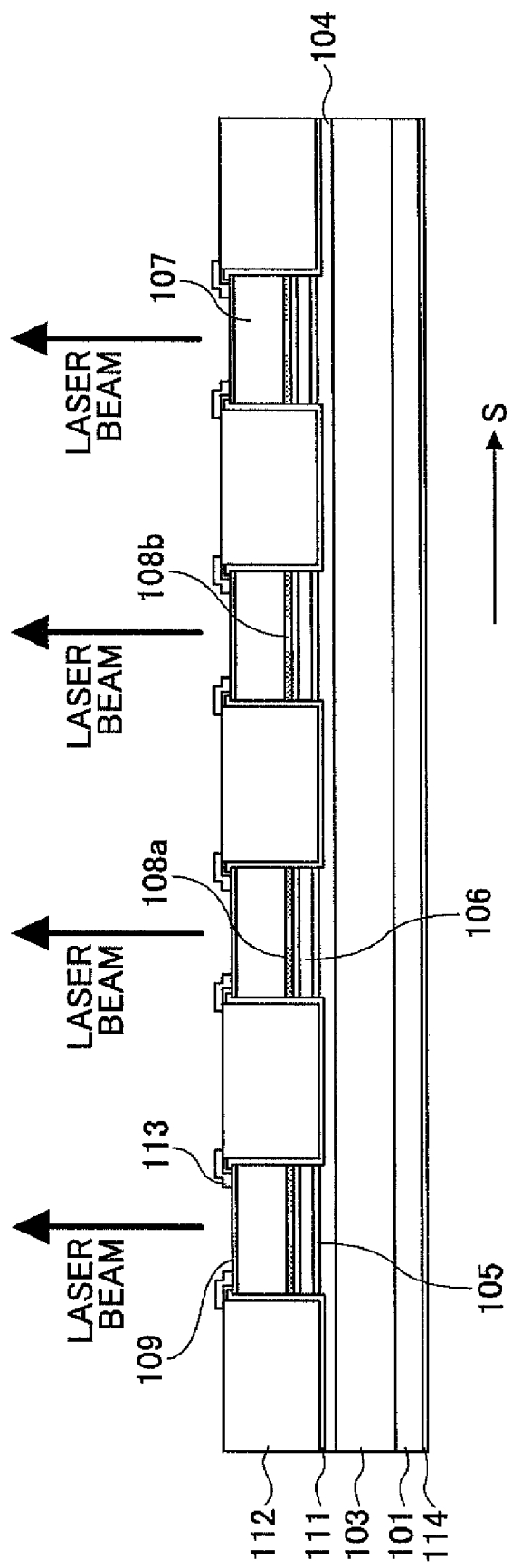
FIG. 18 is a cross-sectional view of light emitters taken along line A-A of FIG. 17.

FIG. 18 is a cross-sectional view of the light emitters taken along line A-A of FIG. 17. As shown in FIG. 18, each of the light emitters has substantially the same configuration as that of the surface-emitting laser 100 described above. Therefore, each of the light emitters in the surface-emitting laser array 500 can be produced in substantially the same manner as the surface-emitting laser 100.

In other words, the surface-emitting laser array 500 is produced by integrating multiple surface-emitting lasers 100 and therefore has substantially the same advantages as those of the surface-emitting laser 100.

As described above, in the surface-emitting laser array 500, the light emitters are arranged at the interval c when orthogonally projected on an imaginary line extending in the sub-direction. By turning on the light emitters at appropriate timings, the light emitters provide an array of light spots arranged at regular intervals in the sub-scanning direction on the photosensitive drum 1030.

Assuming that the interval c is 3 μm and the magnification of the optical system of the optical scanning device 1010 is 1.8, this configuration enables scanning at a resolution of 4800 dpi. The scanning resolution or the print quality can be further improved by increasing the number of light emitters in the main-direction, by decreasing the interval d and thereby decreasing the interval c of the light emitters, or by decreasing the magnification of the optical system. The scanning interval in the main-scanning direction can be easily adjusted by controlling the turn-on timings of the light emitters.

This configuration allows the laser printer 1000 to form an image with higher dot density without lowering the printing speed. Also, with the dot density unchanged, the above configuration makes it possible to increase the printing speed.

Further, since the polarization states of light beams from the light emitters are stable and uniform, the laser printer 1000 can stably form a high-quality image.

Meanwhile, a gap between adjacent light emitters is preferably 5 μm or larger to electrically and spatially separate the light emitters. If the gap is too small, it becomes difficult to control the etching process during production. The size of the mesa (the length of one side) is preferably greater than or equal to 10 μm. If the mesa is too small, heat generated during operation is trapped and the characteristics of the laser may be degraded.

The oscillation wavelength of the light emitter is not limited to a 780-nm band as in the above embodiment. The oscillation wavelength of the light emitter may be changed according to the characteristics of the photosensitive drum 1030.

The surface-emitting laser 100 and the surface-emitting laser array 500 may also be used for applications other than an image forming apparatus. In such a case, the oscillation wavelength may be changed, for example, to a 650-nm band, an 850-nm band, a 980-nm band, a 1.3-μm band, or a 1.5-μm band depending on the application.

In the above embodiment, the surface-emitting laser 100 may be substituted with a surface-emitting laser array where light emitters each having substantially the same configuration as the surface-emitting laser 100 are arranged in one dimension.

An image forming apparatus of the present invention is not limited to the laser printer 1000 of the above embodiment. In other words, the optical scanning device 1010 may be incorporated in other types of image forming apparatuses.

For example, an image forming apparatus that directly forms an image on a recording medium (e.g., paper) that develops color when illuminated by a laser beam may be used.

Also, an image forming apparatus using a silver film as an image carrier may be used. In an image forming apparatus using a silver film, a latent image is formed on the silver film by optical scanning and the formed latent image is developed in substantially the same manner as in silver halide photography. Then, the developed image is transferred onto photographic paper by a printing process as in silver halide photography. Such an image forming apparatus may be used, for example, as an optical plate-making apparatus or an optical plotter for drawing CT scan images.

Figure 19:
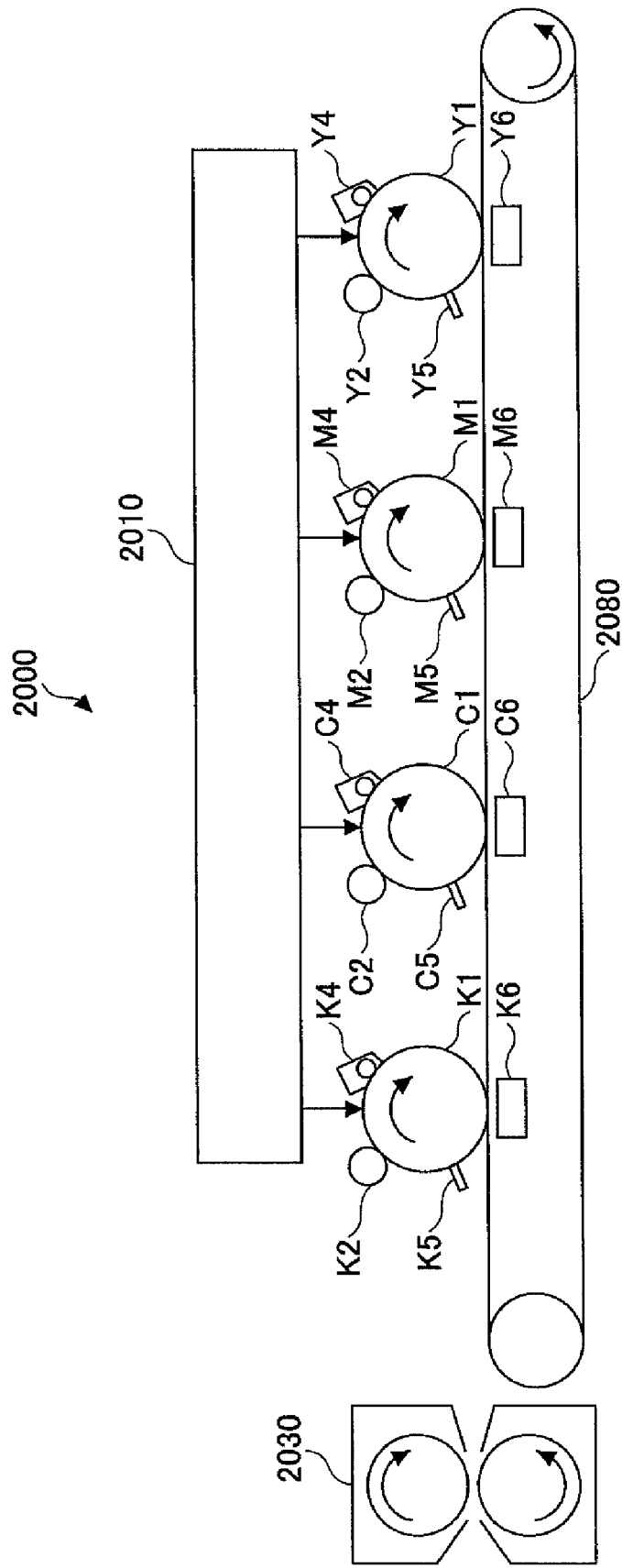
FIG. 19 is a schematic diagram illustrating a configuration of a color printer.

Further, the present invention may be applied to a color printer including multiple photosensitive drums. FIG. 19 is a schematic diagram illustrating a configuration of a color printer 2000.

The color printer 2000 is a tandem color printer that forms a full color image by superposing four colors (black, cyan, magenta, and yellow). The color printer 2000 includes a photosensitive drum K1, a charger K2, a developing unit K4, a cleaning unit K5, and a transfer unit K6 for black; a photosensitive drum C1, a charger C2, a developing unit C4, a cleaning unit C5, and a transfer unit C6 for cyan; a photosensitive drum M1, a charger M2, a developing unit M4, a cleaning unit M5, and a transfer unit M6 for magenta; a photosensitive drum Y1, a charger Y2, a developing unit Y4, a cleaning unit Y5, and a transfer unit Y6 for yellow; an optical scanning device 2010; a transfer belt 2080; and a fusing unit 2030.

The photosensitive drums rotate in the arrow directions shown in FIG. 19; and the chargers, the developing units, the transfer units, and the cleaning units are arranged along the rotational directions of the corresponding photosensitive drums. The chargers uniformly charge the surfaces of the corresponding photosensitive drums. The charged surfaces of the photosensitive drums are scanned by the optical scanning device 2010 to form latent images. Then, the developing units develop the latent images on the corresponding photosensitive drums to form toner images of different colors. The transfer units transfer the toner images of different colors onto a recording paper sheet on the transfer belt 2080 to form a color image, and the fusing unit 2030 fuses the color image onto the recording paper sheet.

The optical scanning device 2010 includes a light source having substantially the same configuration as that of the light source 14 for each color. Therefore, the optical scanning device 2010 has substantially the same advantages as those of the optical scanning device 1010. Also, since the color printer 2000 includes the optical scanning device 2010, the color printer 2000 provides substantially the same advantages as those of the laser printer 1000.

Meanwhile, in the color printer 2000, color misalignment may occur because of manufacturing errors and assembly errors of components. Assuming that each light source of the optical scanning device 2010 includes a surface-emitting laser array similar to the surface-emitting laser array 500, such color misalignment can be corrected or reduced by changing the light emitters to be turned on.

As described above, an aspect of the present invention provides a surface-emitting laser and a surface-emitting laser array that make it possible to stabilize the polarization state of a light beam without affecting the shape of the light beam and without increasing the production costs. Also, an aspect of the present invention provides an optical scanning device that can stably perform optical scanning. Further, an aspect of the present invention provides an image forming apparatus that can form a high-quality image.

The present invention is not limited to the specifically disclosed embodiments, and variations and modifications may be made without departing from the scope of the present invention.

The present application is based on Japanese Priority Application No. 2008-125709 filed on May 13, 2008, and Japanese Priority Application No. 2009-081678 filed on Mar. 30, 2009, the entire contents of which are hereby incorporated herein by reference.

What is claimed is:

1. A surface-emitting laser, comprising:
a substrate having a principal plane, a normal of the principal plane being inclined with respect to one of crystal orientations <1 0 0> toward one of crystal orientations <1 1 1>, wherein the surface-emitting laser is configured to emit light in a direction perpendicular to the substrate; and
multiple semiconductor layers stacked on the substrate, the semiconductor layers including
a resonator structure including an active layer, and
a semiconductor multilayer mirror stacked on the resonator structure and including a confined structure where a current passage area is surrounded by an oxidized area including at least an oxide generated by oxidation of a part of a selective oxidation layer containing aluminum, wherein
when a first axis direction is parallel to a surface of the substrate and orthogonal to both the one of crystal orientations <1 0 0> and the one of crystal orientations <1 1 1> and a second axis direction is orthogonal to both the normal and the first axis direction, a thickness of a portion of the oxidized area where the oxidation has proceeded in the first axis direction is less than a thickness of a portion of the oxidized area where the oxidation has proceeded in the second axis direction;
the semiconductor multilayer mirror includes low-refractive-index layers;
the selective oxidation layer is inserted in one of the low-refractive-index layers, and
the one of the low-refractive-index layers includes a first layer that is composed of a material having a low refractive index and is disposed adjacent to the selective oxidation layer and a second layer that is composed of a material having a low refractive index and is disposed adjacent to the first layer.

2. The surface-emitting laser as claimed in claim 1, wherein a thickness of a first part of the portion of the oxidized area where the oxidation has proceeded toward one end of the second axis direction is greater than a thickness of a second part of the portion of the oxidized area where the oxidation has proceeded toward the other end of the second axis direction.

3. The surface-emitting laser as claimed in claim 2, wherein when a rate of the oxidation in the first axis direction is 1, a rate of the oxidation toward the one end of the second axis direction is less than 0.995.

4. A surface-emitting laser array comprising a plurality of the surface-emitting lasers of claim 1.

5. An optical scanning device for optically scanning a target surface, comprising:
  a light source including the surface-emitting laser of claim 1;
  a deflector configured to deflect light emitted from the light source; and
  a scanning optical system configured to focus the light deflected by the deflector on the target surface.

6. An optical scanning device for optically scanning a target surface, comprising:
  a light source including the surface-emitting laser array of claim 4;
  a deflector configured to deflect light emitted from the light source; and
  a scanning optical system configured to focus the light deflected by the deflector on the target surface.

7. An image forming apparatus, comprising:
  at least one image carrier; and
  the optical scanning device of claim 5 configured to scan the at least one image carrier with light according to image information.

8. The image forming apparatus as claimed in claim 7, wherein the image information is multicolor image information.

9. An image forming apparatus, comprising:
  at least one image carrier; and
  the optical scanning device of claim 6 configured to scan the at least one image carrier with light according to image information.

10. The image forming apparatus as claimed in claim 9, wherein the image information is multicolor image information.

11. The surface-emitting laser as claimed in claim 1, wherein the current passage area has a biaxially symmetric shape.

12. A surface-emitting laser, comprising:
  a substrate having a principal plane, a normal of the principal plane being inclined with respect to one of crystal orientations <1 0 0> toward one of crystal orientations <1 1 1>, wherein the surface-emitting laser is configured to emit light in a direction perpendicular to the substrate; and
  multiple semiconductor layers stacked on the substrate, the semiconductor layers including
  a resonator structure including an active layer, and
  a semiconductor multilayer mirror stacked on the resonator structure and including a confined structure where a current passage area is surrounded by an oxidized area including at least an oxide generated by oxidation of a part of a selective oxidation layer containing aluminum, wherein
  the semiconductor multilayer mirror includes low-refractive-index layers,
  the selective oxidation layer is inserted in one of the low-refractive-index layers, and
  the one of the low-refractive-index layers includes a first layer that is composed of a material having a low refractive index and is disposed adjacent to the selective oxidation layer and a second layer that is composed of a material having a low refractive index and is disposed adjacent to the first layer.

13. The surface-emitting laser as claimed in claim 12, wherein the first layer and the second layer include aluminum and an amount of aluminum in the first layer is greater than an amount of aluminum in the second layer.

14. The surface-emitting laser as claimed in claim 12, wherein the selective oxidation layer is adjacent to a first surface of the first layer, and the second layer is adjacent to another surface of the first layer which is opposite to said first surface of the first layer.

* * * * *